(12) United States Patent
Lindell et al.

(10) Patent No.: US 6,978,125 B2
(45) Date of Patent: Dec. 20, 2005

(54) METHODS AND APPARATUS FOR TUNING PRE-SELECTION FILTERS IN RADIO RECEIVERS

(75) Inventors: Bo Lindell, Lindingo (SE); Martin Isberg, Lund (SE); Björn Lindqvist, Bjärred (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 811 days.

(21) Appl. No.: 09/899,339

(22) Filed: Jul. 5, 2001

(65) Prior Publication Data

US 2003/0008628 A1   Jan. 9, 2003

(51) Int. Cl.[7] ............................ H04B 1/18; H04B 1/26; H04B 7/00
(52) U.S. Cl. ............................. 455/183.1; 455/192.1; 455/255; 455/266; 455/313
(58) Field of Search .................. 455/183.1, 192.1, 455/254, 255, 266, 296, 307, 313, 318, 319

(56) References Cited

U.S. PATENT DOCUMENTS

| | | | |
|---|---|---|---|
| 4,528,698 A * | 7/1985 | Fraser .................... | 455/319 |
| 4,837,852 A | 6/1989 | Takada et al. | |
| 5,065,453 A | 11/1991 | Thomas | |
| 5,150,085 A | 9/1992 | Hales | |
| 5,408,196 A * | 4/1995 | Sempel et al. ........... | 329/325 |
| 5,428,829 A | 6/1995 | Osburn et al. | |
| 5,752,179 A | 5/1998 | Dobrovolny | |
| 6,052,420 A | 4/2000 | Yeap et al. | |
| 6,266,522 B1 * | 7/2001 | Holden et al. .......... | 455/339 |
| 6,631,265 B2 * | 10/2003 | Holden et al. .......... | 455/439 |
| 2002/0151287 A1 * | 10/2002 | Lindquist et al. ....... | 455/183.1 |

FOREIGN PATENT DOCUMENTS

| | | |
|---|---|---|
| EP | 0 003 634 A1 | 8/1979 |
| EP | 0 618 676 A1 | 10/1994 |
| EP | 1 128 555 A1 | 8/2001 |
| JP | 2170627 A1 | 7/1990 |
| WO | 95/09480 A1 | 4/1995 |
| WO | 99/40679 A1 | 8/1999 |
| WO | 00/28664 A2 | 5/2000 |

OTHER PUBLICATIONS

Klien W., et al., "TC-Tuner ATA", Radio Fernsehen Elektronik, VEB Berlag Technik, Beline, DE, vol. 44, No. 2, Feb. 1, 1995, pp. 26-27.

* cited by examiner

*Primary Examiner*—Harry S. Hong
(74) *Attorney, Agent, or Firm*—Potomac Patent Group, PLLC

(57) ABSTRACT

A tuning arrangement in a radio receiver includes a front-end circuit having a tunable band-pass filter that is capable of tunably selecting channels within at least one frequency band of an RF signal. A noise source coupled to an input of the tunable band-pass filter introduces a wide-band noise signal into the front-end circuit. A signal detector coupled to an output of the front-end circuit measures at least one signal power associated with a filtered noise signal derived from the wide-band noise signal. A tuning controller, coupled to the tunable band-pass filter by a tuning control signal, adjusts the tuning control signal in response to the at least one measured signal power for tuning the tunable band-pass filter to a desired filter response.

59 Claims, 18 Drawing Sheets

METHODS AND APPARATUS FOR TUNING PRE-SELECTION FILTERS IN RADIO RECEIVERS

BACKGROUND

The present invention relates to tunable pre-selection filters, and particularly to methods and apparatus for tuning pre-selection filters in radio receivers.

Radio receivers are designed to receive modulated signals (e.g., amplitude modulated (AM), frequency modulated (FM), and 8-symbol phase shift keying (8-PSK) signals) centered at particular carrier frequencies. In typical broadcast systems, a broad band of carrier frequencies is typically divided up into a number of adjacent channels, each centered at a unique carrier frequency and having its own associated narrow bandwidth. The adjacent channels are designed not to overlap one another, in order to avoid interference between neighboring channels.

When a radio receiver is tuned to a particular one of these channels, it needs to be selectively responsive to the radio signals within the narrow bandwidth centered at the channel's center frequency. At the same time, the radio receiver needs to be capable of rejecting (i.e., being substantially non-responsive to) signals falling outside of its narrow frequency band.

Although the radio receiver is tuned to receive a channel at a particular carrier frequency, this high frequency signal (referred to as "radio frequency", or RF) is typically converted to a lower frequency, or "baseband", signal before the information modulated onto the signal is extracted and processed. This frequency conversion is typically performed by means of mixers, which mix the received RF signal with another signal. The RF signal (having a given carrier frequency) may be converted directly to the baseband signal by mixing the received RF signal with a signal oscillating at the same carrier frequency. Receivers that operate in this fashion are called "homodyne" receivers.

It is often desirable to convert the RF signal down to the baseband signal in incremental steps, rather than in one step. In such cases, the RF signal may first be converted into one or more so-called "intermediate frequency" (IF) signals, which are centered at respective frequencies lying somewhere in-between those of the RF signal and the baseband signal. Receivers that operate in this fashion are called "heterodyne" receivers.

Generation of an IF signal may be accomplished by mixing the original RF signal with a locally generated signal oscillating at a different carrier frequency. The resultant IF signal will carry the desired information on an oscillating signal whose center frequency is related to the difference between the RF carrier frequency and the locally generated signal. Because it is usually desired to generate an IF signal whose frequency is fixed, regardless of the carrier frequency of the received RF signal, receivers are designed such that the difference between the received RF carrier frequency and the frequency of the locally-generated signal will be maintained at a constant value. For example, as the front-end of the receiver is adjusted to receive a higher/lower RF carrier signal, the generator of the locally-generated signal is correspondingly adjusted to generate a higher/lower frequency signal, such that the difference between the two frequencies does not change.

Regardless of the type, a receiver needs to be capable of withstanding the presence of strong interfering signals within the same frequency band as the desired received signal. However, in many radio environments such as that found in mobile telecommunications, there can exist interfering signals that are only a few megahertz (MHZ) away from the desired signal. Furthermore, these interfering signals can sometimes be several orders of magnitude stronger than the desired signal.

To mitigate the effects of such strong nearby interfering signals, while simultaneously achieving as good a dynamic range as possible, a receiver is often a compromise between design choices favoring small signal properties (e.g., low noise characteristics) and other design choices favoring large signal properties (e.g., intercept point and signal compression). To illustrate this point, several conventional receivers will be described.

FIG. 1 is a block diagram of a conventional single band homodyne receiver. An RF signal is received by an antenna 101 and supplied to a band-pass filter 103 that suppresses all out-of-band interferers so that they will not exceed the level of the in-band interferers. This is done in order to prevent blocking of the receiver. In the exemplary embodiment, the desired frequency band is the range from 1805 to 1880 MHZ. The band-pass filter thus acts as a band selection filter, also known as a pre-selection filter or blocking filter.

From the output of the band-pass filter 103, the received signal is supplied to a low noise amplifier 105. After amplification, the signal is down-converted to respective in-phase (I) and quadrature (Q) baseband signals by first and second mixers 107, 109. This is accomplished by mixing the amplified received signal with respective locally-generated signals that each oscillate at the desired RF frequency, but which are 90 degrees out of phase with respect to one another. The purpose of separating the received signal into the I and Q baseband signals is to facilitate the demodulation of the signal (i.e., the extraction of the underlying information carried by the received signal). This aspect of the receiver operation is well-known, and need not be discussed here in further detail.

The respective locally-generated signals for use by the first and second mixers 107, 109 are created by first using a local oscillator circuit 125 to generate a signal of the desired frequency. The local oscillator circuit 125 is often implemented as a phase-locked loop (PLL). The signal from the local oscillator circuit 125 is then supplied to a phase-shifting circuit 111 that shifts the phase of the locally-generated signal by 90 degrees. The original (non-shifted) signal may then be supplied to the first mixer 107, while the phase-shifted signal may be supplied to the second mixer 109.

After down-conversion, the I and Q baseband signals are supplied to respective first and second channel selection filters 113, 115. The pass-band of each of these channel selection filters 113, 115 is much narrower than that of the band selection filter 103 because it is used to separate the received signal from the in-band interferers. After channel selection, the resultant I and Q signals could be subjected to further filtering and amplification, e.g., by respective first and second amplifiers 117, 119. In digital environments, the resultant analog signals may be converted into digital form by respective first and second analog-to-digital (A/D) converters 121, 123.

At this point it should be noted that, in the case of a heterodyne receiver, an extra mixing stage (not shown) would be disposed between the output of the low noise amplifier 105 and the inputs of the first and second mixers 107, 109. The extra mixing stage would generate an IF signal by mixing the originally received RF signal with a locally-generated signal that oscillates at a frequency that differs from the carrier frequency of the RF signal by a known amount. A channel selection filter may then operate on the IF signal, and its output supplied to the first and second mixers 107, 109 for a second down-conversion to the baseband frequency. In this case, the frequency of the locally-generated signals respectively supplied to the first and second mixers 107, 109 would be designed to match the frequency of the IF signal, rather than the frequency of the RF signal.

The active parts of the receiver, such as the low noise amplifier 105 and mixers 107, 109, are designed to exhibit good noise properties while also being able to withstand strong signals without degrading performance for weak signals. Consequently, the design will always be a trade-off between considerations relating to noise, linearity, and power consumption.

In many applications, it is desirable to have a radio receiver that is capable of operating in any of a number of distinct frequency bands. For example, a cellular telephone may be designed to operate in accordance with any of a number of different standards, each operating within a distinct frequency band. FIG. 2 is a block diagram of a conventional dual-band homodyne receiver that is capable of receiving signals in either of two frequency bands: a first band ranging from 1805 to 1880 MHZ, and a second band ranging from 1930 to 1990 MHZ. In order to enable the reception of two distinct frequency bands, the front-end of the receiver includes two distinct paths. In a first path, a first band-pass filter 201 is designed to suppress frequencies outside the range from 1805 to 1880 MHZ. The resultant signal is supplied to a first low noise amplifier 203. Similarly, in a second path of the front-end of the receiver, a second band-pass filter 205 is designed to suppress frequencies outside the range from 1930 to 1990 MHZ. The resultant signal from the second band-pass filter 205 is supplied to a second low noise amplifier 207. Selection of the desired frequency band may be accomplished by controlling the first and second low noise amplifiers 203, 207 in such a way that only one of them supplies an output to the remaining components of the receiver. These remaining components operate in the same way as the counterparts described above with respect to the single band receiver depicted in FIG. 1.

A problem with the above-described receivers is that strong in-band interferers may pass through the band selection filter without any suppression. These in-band interferers must first be amplified and down-converted before they can be suppressed by any channel selection filtering (e.g., by the channel selection filters 113, 115). These in-band interferers put very high linearity requirements on the front-end part of the receiver in order to avoid desensitization due to:

1. Strong signals driving the front-end into compression and thereby degrading the signal-to-noise ratio (SNR) in the receiver.
2. Strong signals causing reciprocal mixing of local oscillator phase noise.
3. Strong signals causing distortion through intermodulation caused by second or third order distortion (IP2, IP3). Second order distortion products due to AM interferers are a well-known problem in homodyne or low-IF receivers.

Another problem associated with multi-band receivers (e.g., the dual-band receiver illustrated in FIG. 2) is that these receivers add extra filters and switching mechanisms, even if the receive bands are relatively close, as in the DCS 1800 and PCS 1900 cellular communication systems. These extra components increase the complexity and cost of the receiver. The additional band switching devices also degrade the noise performance of the receiver due to the increased insertion loss between the antenna and the receiver front-end.

As a solution to the above identified problems, it has been proposed to move some of the channel selectivity to the filter preceding the front-end. For example, U.S. Pat. No. 5,065,453 discloses an electrically-tunable band-pass filter for providing front-end selectivity in a superheterodyne radio receiver. The band-pass filter provides a narrow front-end filter which is tuned automatically as the local oscillator frequency is changed.

U.S. Pat. No. 5,752,179 discloses a selective RF circuit with varactor tuned and switched band-pass filters. In this arrangement, low-, mid- and high-band-pass filters are selectively activated to cover a tuning range of the receiver. Each of these three filters is, itself, tunable when activated.

U.S. Pat. No. 5,150,085 discloses an electronically tunable front-end filter for use in a radio apparatus. The filter includes a plurality of isolated ceramic resonators, each having an associated varicap diode network to enable electronic tuning respective of ceramic resonators.

JP 2170627 A discloses a tunable filter interposed between two integrated circuits (ICs). The first of the ICs is an RF amplifier, while the second of the ICs is a mixer. The tunable filter is tuned by interlocking with a tuning voltage of an oscillating circuit.

Since, in these arrangements, the front-end filter acts as a band selection filter, it must be tunable to be able to select any channel within the receiver band. The tuning of this tunable filter must then be arranged in some clever way in order not to degrade performance for the received signal. That is, the tuning must always result in the best possible receiver for the received signal and at the same time offer some attenuation of strong in-band interferers located some channels away from the received signal.

Thus, there are very severe tuning requirements placed on the tunable front-end filter. However, it is difficult to tune these filters to the correct frequency because of spread in component values and because of temperature-related drift of the filter's center frequency. This is conventionally solved by production trimming, which is very time consuming if it has to be performed for all temperatures. Another problem with trimming only once in a factory is that this trim value remains constant while the tunable front-end filter changes its characteristics due to aging, temperature drift and/or moisture, which changes cannot be measured. Consequently, the receiver's performance degrades over time.

SUMMARY

It is therefore an object of the present invention to provide a methods and apparatus for tuning receiver pre-selection filters. This and other objects are addressed by methods and apparatus for tuning pre-selection filters in radio receivers.

According to one aspect of the invention, a tuning arrangement includes a front-end circuit having a tunable band-pass filter that is capable of tunably selecting channels within at least one frequency band of an RF signal. A noise source coupled to an input of the tunable band-pass filter introduces a wide-band noise signal into the front-end circuit. A signal detector coupled to an output of the front-end circuit measures at least one signal power associated with a filtered noise signal derived from the wide-band noise signal. A tuning controller coupled to the tunable band-pass filter by a tuning control signal adjusts the tuning control signal in response to the at least one measured signal power for tuning the tunable band-pass filter to a desired filter response.

According to another aspect of the invention, the arrangement further includes a memory coupled to the signal detector and to the tuning controller for storing the at least one measured signal power for use by the tuning controller in adjusting the tuning control signal.

According to yet another aspect of the invention, the tuning controller adjusts the tuning control signal in a manner such that the tuning control signal will cause the signal power associated with the filtered noise signal to achieve a maximum value.

According to yet another aspect of the invention, the arrangement includes a down-converter having an input coupled to an output of the tunable band-pass filter, the down-converter for generating a baseband signal by mixing the filtered noise signal with a local oscillator signal.

According to yet another aspect of the invention, the arrangement further includes a channel selection filter having an input coupled to an output of the down-converter and having an output that corresponds to the output of the front-end circuit.

According to yet another aspect of the invention, the channel selection filter is a low-pass filter.

According to yet another aspect of the invention, the down-converter and channel selection filter together achieve a composite filter response having a center frequency that is approximately equal to a difference between a center frequency of the desired response of the tunable band-pass filter and the frequency of the local oscillator signal.

According to yet another aspect of the invention, the tunable band-pass filter is tunable within a range spanning one predefined radio frequency band.

According to yet another aspect of the invention, the tunable band-pass filter is tunable within a range spanning at least two predefined radio frequency bands.

According to yet another aspect of the invention, the arrangement further includes a first down-converter coupled to an output of the tunable band-pass filter for generating an intermediate frequency (IF) signal by mixing the filtered noise signal with a first local oscillator signal.

According to yet another aspect of the invention, the arrangement further includes a first channel selection filter having an input coupled to an output of the first down-converter.

According to yet another aspect of the invention, the arrangement further includes a second down-converter having an input coupled to an output of the first channel selection filter for generating a baseband signal by mixing the IF signal with a second local oscillator signal.

According to yet another aspect of the invention, the arrangement further includes a second channel selection filter having an input coupled to an output of the second down-converter and having an output that corresponds to the output of the front-end circuit.

According to yet another aspect of the invention, the first channel selection filter is a band-pass filter and the second channel selection filter is a low-pass filter.

According to yet another aspect of the invention, the first and second down-converters and the first and second channel selection filters together achieve a composite filter response having a center frequency that is approximately equal to a center frequency of the desired response of the tunable band-pass filter minus the frequencies of the first and second local oscillator signals.

According to yet another aspect of the invention, the noise source is at least one of: a stand-alone noise generator separate from the radio receiver; a radio transmitter power amplifier operatively coupled to the radio receiver; a dedicated noise power amplifier integrated into the radio receiver and used only during a radio tuning phase; and a low noise amplifier for amplifying the RF signal during normal radio operation and configured for generating the wide-band noise signal during the radio tuning phase.

According to yet another aspect of the invention, the tuning controller is at least one of: a stand-alone processor separate from the radio receiver; a dedicated microprocessor integrated into the radio receiver and used only during a radio tuning phase; a receiver signal processor for processing the RF signal during normal radio operation and configured for adjusting the tuning control signal during the radio tuning phase; and a software program executing on the receiver signal processor during the radio tuning phase.

According to yet another aspect of the invention, the wide-band noise signal has a bandwidth that is at least equal to a tuning range of the tunable band-pass filter.

BRIEF DESCRIPTION OF THE DRAWINGS

The objects and advantages of the invention will be understood by reading the following detailed description in conjunction with the drawings in which.

DETAILED DESCRIPTION

Figure 1:
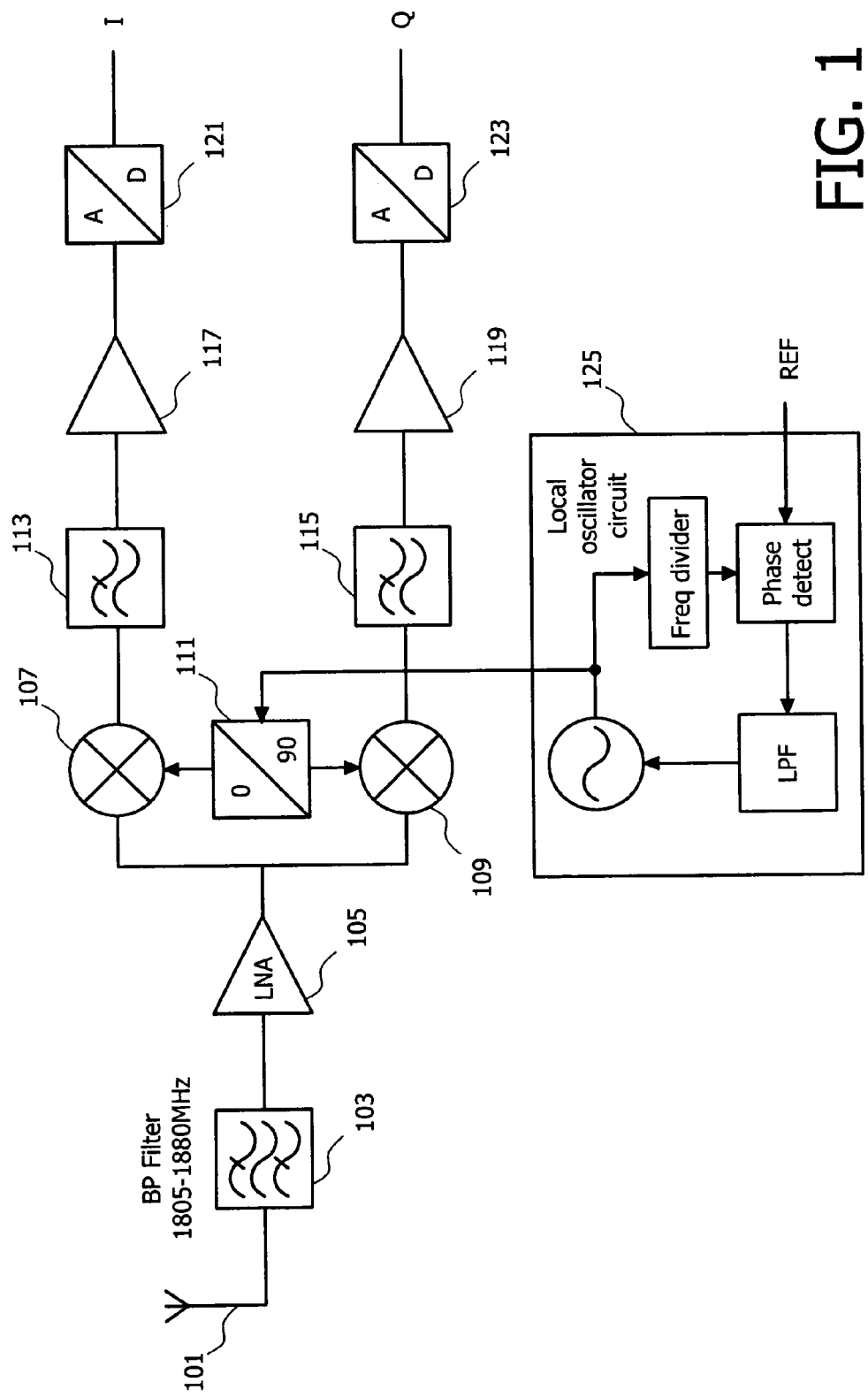
FIG. 1 is a block diagram of a conventional single band homodyne receiver.
Figure 2:
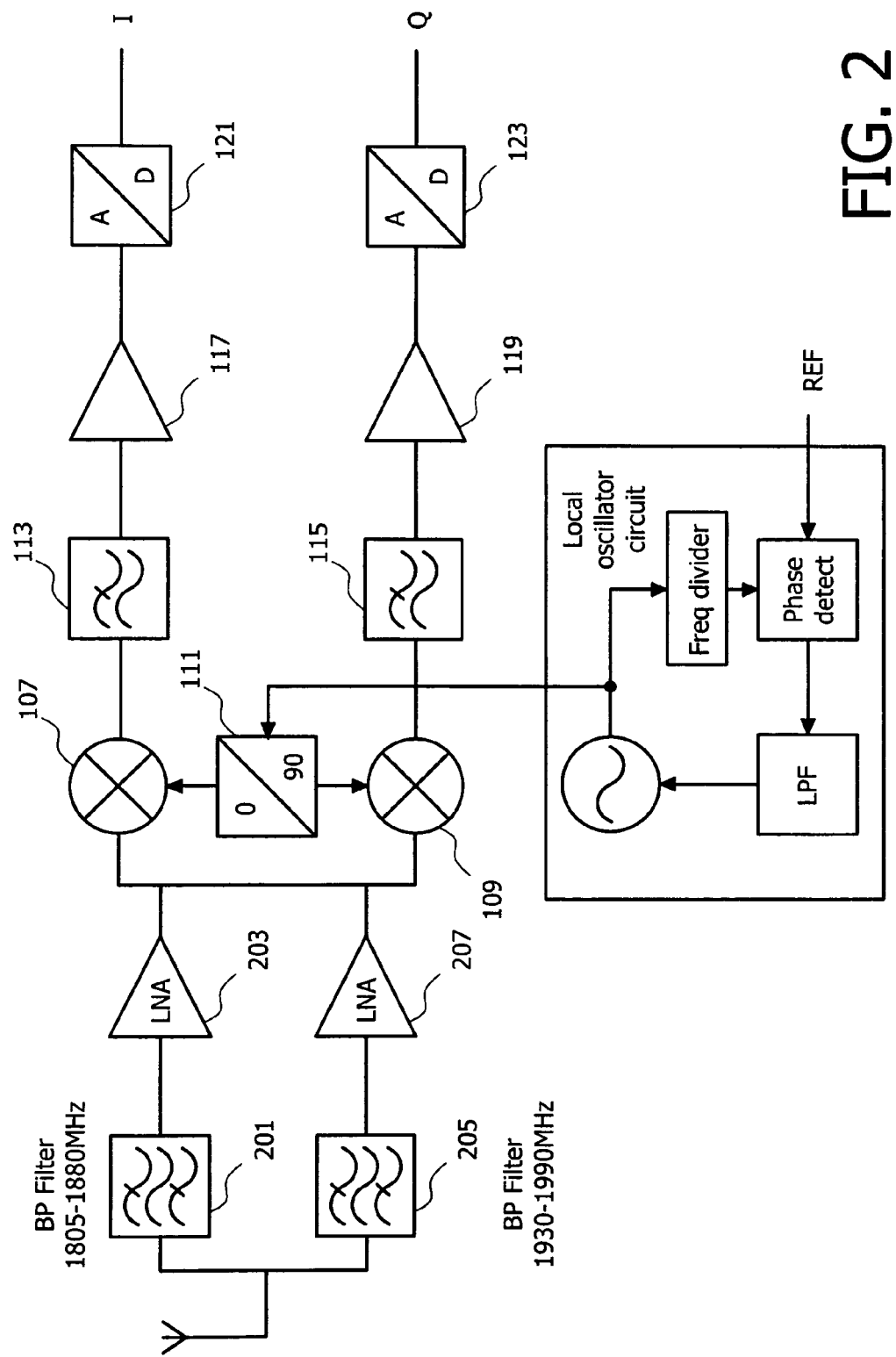
FIG. 2 is a block diagram of a conventional dual-band homodyne receiver.

The various features of the invention will now be described with respect to the figures, in which like parts are identified with the same reference characters.

The invention involves the use of tunable band-pass filters in a radio receiver. The tunable band-pass filters are used as front-end selection filters in a radio receiver. Tunable band-pass filters may also used as reference filters for tuning corresponding front-end selection filters using signals derived from the local oscillator signal. A control unit monitors a signal derived from the output of a reference filter, and generates a control signal for tuning the reference filter in a manner that results in a desired output. The same control signal is used for tuning a corresponding front-end selection filter. The front-end selection and reference tunable band-pass filters are preferably matched, so that the control signal for tuning one of the filters will also accurately tune the other filter.

Figure 3:
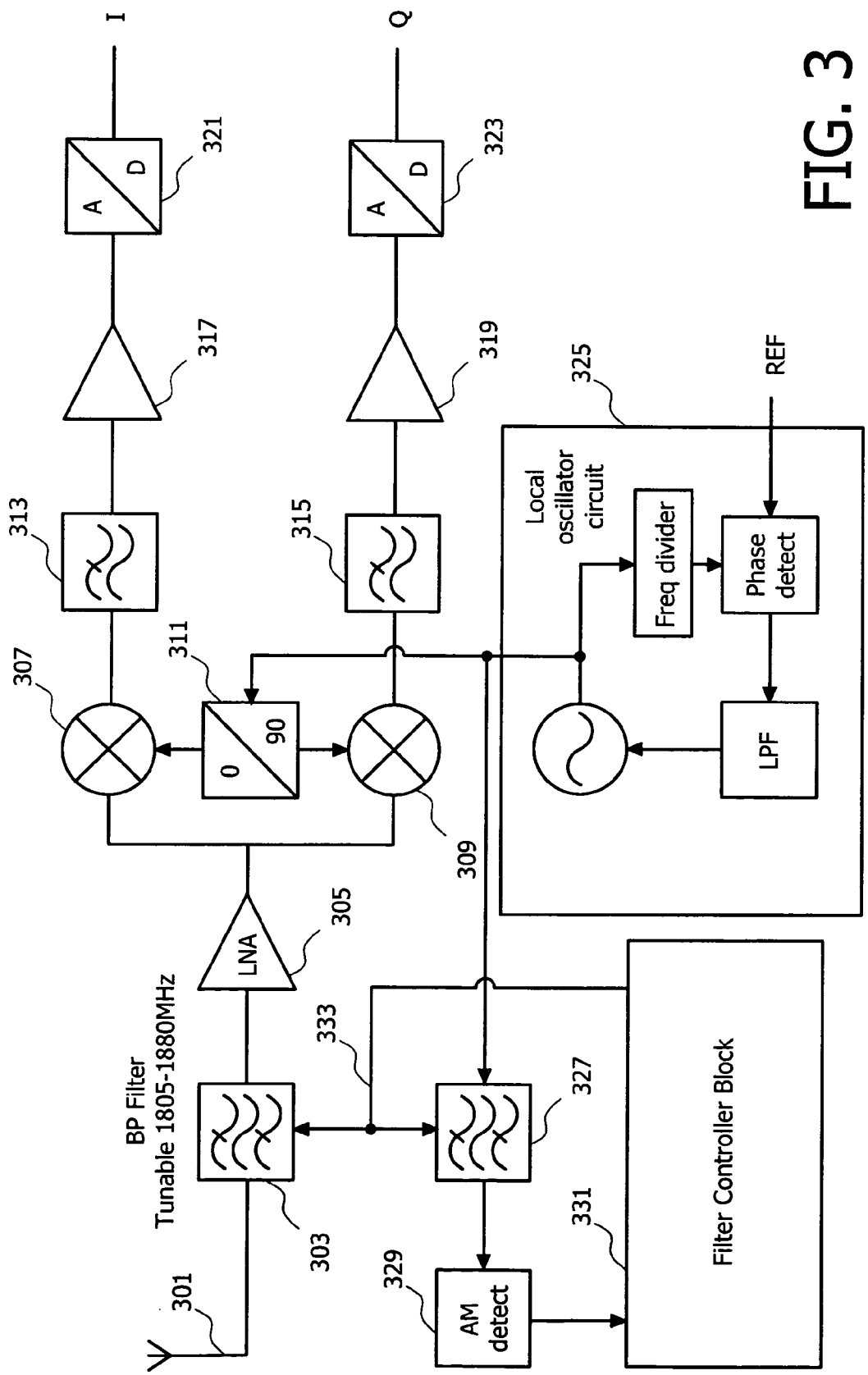
FIG. 3 is a block diagram of a single-band direct conversion radio receiver in accordance with the invention.

The various aspects of the invention will now be further described in connection with a number of exemplary embodiments. Referring first to FIG. 3, this is a block diagram of a single-band direct conversion radio receiver. As used herein, the term "direct conversion" may alternatively mean a zero-IF receiver, or a low-IF receiver (i.e., a receiver whose IF is in the same range as the channel spacing). In the exemplary receiver, I and Q digital signals are generated from a received RF signal. To accomplish this function, the RF signal is received by an antenna 301 and supplied to a tunable band-pass filter, herein referred to as a tunable pre-selection filter 303. The tunable pre-selection filter 303 is capable of tunably selecting channels within the desired frequency band. In the exemplary embodiment, the desired frequency band is the range from 1805 to 1880 MHZ.

From the output of the tunable pre-selection filter 303, the received signal is supplied to a low noise amplifier 305. After amplification, the signal is down-converted to respective in-phase (I) and quadrature (Q) baseband signals by first and second mixers 307, 309. This is accomplished by mixing the amplified received signal with respective locally-generated signals that each oscillate at (or near) the desired RF frequency, but which are 90 degrees out of phase with respect to one another. As indicated earlier, the purpose of separating the received signal into the I and Q baseband signals is to facilitate the demodulation of the signal (i.e., the extraction of the underlying information carried by the received signal). This aspect of the receiver operation is well-known, and need not be discussed here in further detail.

The respective locally-generated signals for use by the first and second mixers 307, 309 are created by first using a local oscillator circuit 325 to generate a signal of the desired frequency. The local oscillator circuit 325 is preferably implemented as a phase-locked loop (PLL). The signal from the local oscillator circuit 325 is then supplied to a phase-shifting circuit 311 that shifts the phase of the locally-generated signal by 90 degrees. The original (non-shifted) signal may then be supplied to the first mixer 307, while the phase-shifted signal may be supplied to the second mixer 309.

After down-conversion, the I and Q baseband signals are supplied to respective first and second channel selection filters 313, 315. The purpose of the first and second channel selection filters 313, 315 is to further separate the received signal from the in-band interferers. In addition, the first and second channel selection filters 313, 315 may condition their respective input signals for the purpose of avoiding aliasing that can result from sampling that is performed by downstream analog-to-digital converters. A third possible use of the first and second channel selection filters 313, 315 is for channel filtering, although this could alternatively be performed digitally by downstream receiver components.

After channel selection, the resultant I and Q signals could be subjected to further filtering and amplification, e.g., by respective first and second amplifiers 317, 319. Because this exemplary embodiment is a digital environment, the resultant analog signals are converted into digital form by respective first and second analog-to-digital (A/D) converters 321, 323.

For good performance, it is necessary to accurately tune the tunable pre-selection filter 303 so that the desired channel will be selected. To accomplish this function, the signal from the local oscillator circuit 325 is supplied not only to the phase-shifting circuit 311, but also to a second tunable band-pass filter, herein referred to as a tunable reference filter 327. The tunable reference filter 327 is preferably identical to the tunable pre-selection filter 303. Although filter characteristics may vary from component to component, it is generally the case that two identical filters will be well matched when manufactured on the same component (i.e., the same IC). Thus, a control signal for tuning one such filter to achieve a desired filtering characteristic may also be used for tuning the other filter to achieve the same filtering characteristic.

Continuing with a description of the exemplary embodiment, the output of the tunable reference filter 327 is supplied to an AM detector 329. The output of the AM detector 329 is supplied to a filter controller block 331, which may be a hard-wired controller, a programmable controller executing a suitable set of program instructions, or any combination of the above. The filter controller block 331 is configured to monitor the signal from the AM detector 329, and to generate a control signal 333 that adjusts the tunable reference filter 327 in a manner that maximizes the monitored signal from the AM detector 329. In accordance with one aspect of the invention, this same control signal 333 is also supplied to a control input of the tunable pre-selection filter 303. In the case of a homodyne receiver, this arrangement will cause the tunable pre-selection filter 303 to select (i.e., pass) those components of the received signal having the same frequency as the local oscillator signal. In the case of a low-IF receiver, this arrangement will cause the tunable pre-selection filter 303 to select (i.e., pass) those components of the received signal having a frequency that is slightly offset from the local oscillator frequency. This offset can be tolerable if the bandwidth of the filter is wide enough.

Figure 4:
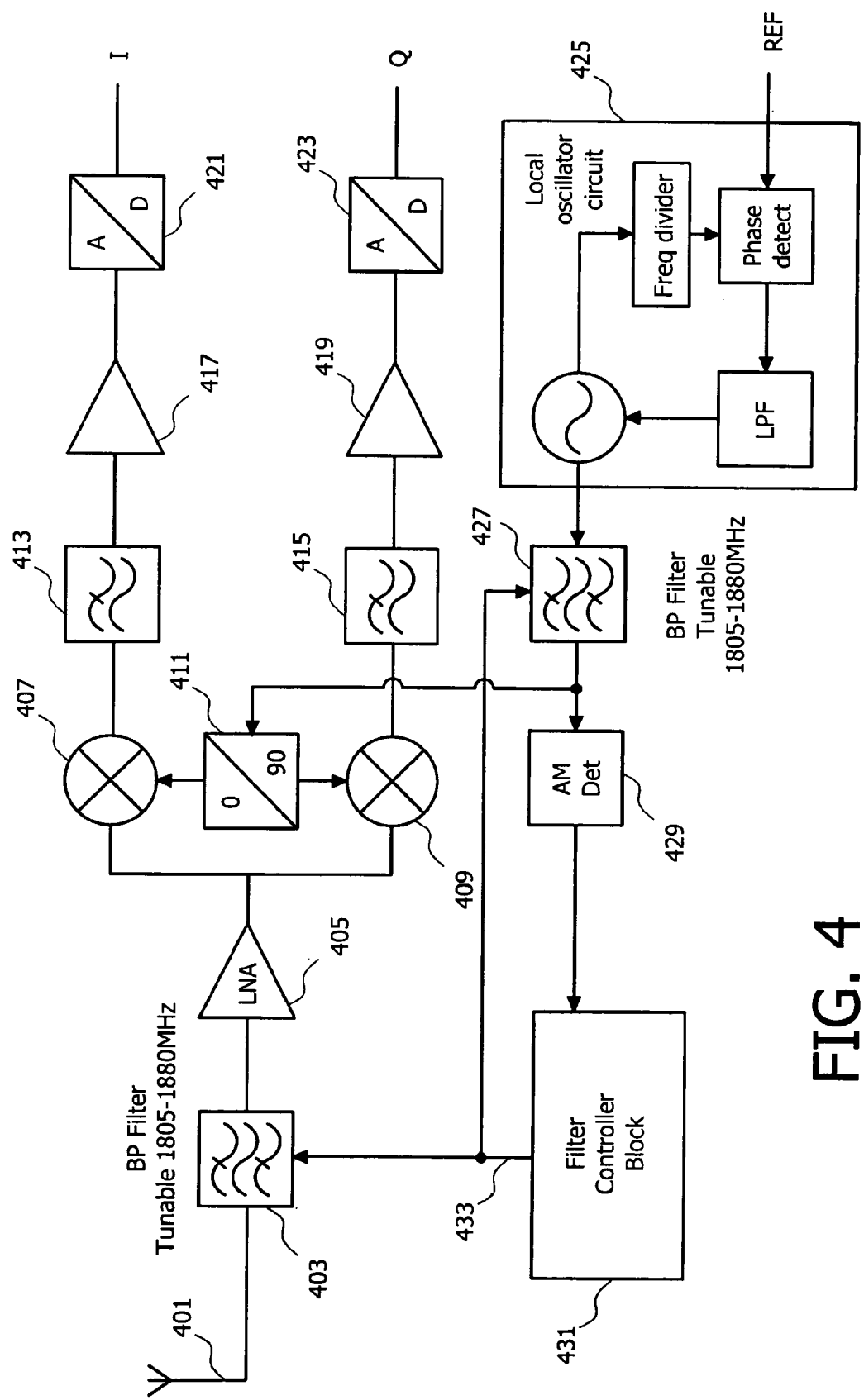
FIG. 4 is a block diagram of another embodiment of a single-band direct conversion radio receiver in accordance with the invention.

Other aspects of the invention will now be further described in connection with an alternative exemplary embodiment. Referring now to FIG. 4, this is a block diagram of a single-band direct conversion radio receiver. Again, as used herein, the term "direct conversion" may alternatively mean a zero-IF receiver, or a low-IF receiver (i.e., a receiver whose IF is in the same range as the channel spacing). The exemplary receiver of FIG. 4 is similar in operation to the one illustrated in FIG. 3. In particular, I and Q digital signals are generated from a received RF signal. To accomplish this function, the RF signal is received by an antenna 401 and supplied to a tunable band-pass filter, herein referred to as a tunable pre-selection filter 403. The tunable pre-selection filter 403 is capable of tunably selecting channels within the desired frequency band. In the exemplary embodiment, the desired frequency band is the range from 1805 to 1880 MHZ.

From the output of the tunable pre-selection filter 403, the received signal is supplied to a low noise amplifier 405. After amplification, the signal is down-converted to respective in-phase (I) and quadrature (Q) baseband signals by first and second mixers 407, 409. This is accomplished by mixing the amplified received signal with respective locally-generated signals that each oscillate at (or near) the desired RF frequency, but which are 90 degrees out of phase with respect to one another. As indicated earlier, the purpose of separating the received signal into the I and Q baseband signals is to facilitate the demodulation of the signal (i.e., the extraction of the underlying information carried by the received signal). This aspect of the receiver operation is well-known, and need not be discussed here in further detail.

The respective locally-generated signals for use by the first and second mixers 407, 409 are created by first using a local oscillator circuit 425 to generate a signal of the desired frequency. The local oscillator circuit is preferably implemented as a PLL. This embodiment differs from the one described above with reference to FIG. 3 in that the signal supplied by the local oscillator circuit 425 is supplied to a second tunable band-pass filter, herein referred to as a tunable reference filter 427. The tunable reference filter 427 is preferably identical to the tunable pre-selection filter 403.

The output of the tunable reference filter 427 is supplied to a phase-shifting circuit 411 that shifts the phase of the locally-generated signal by 90 degrees. The original (non-shifted) signal may then be supplied to the first mixer 407, while the phase-shifted signal may be supplied to the second mixer 409.

After down-conversion, the I and Q baseband signals are supplied to respective first and second channel selection filters 413, 415. The purpose of the first and second channel selection filters 413, 415 is to further separate the received signal from the in-band interferers. In addition, the first and second channel selection filters 413, 415 may condition their respective input signals for the purpose of avoiding aliasing that can result from sampling that is performed by downstream analog-to-digital converters. A third possible use of the first and second channel selection filters 413, 415 is for channel filtering, although this could alternatively be performed digitally by downstream receiver components.

After channel selection, the resultant I and Q signals could be subjected to further filtering and amplification, e.g., by respective first and second amplifiers 417, 419. Because this exemplary embodiment is a digital environment, the resultant analog signals are converted into digital form by respective first and second analog-to-digital (A/D) converters 421, 423.

For good performance, it is necessary to accurately tune the tunable pre-selection filter 403 so that the desired channel will be selected. To accomplish this function, the signal supplied at the output of the tunable reference filter 427 is supplied to an AM detector 429. The output of the AM detector 429 is supplied to a filter controller block 431, which may be a hard-wired controller, a programmable controller executing a suitable set of program instructions, or any combination of the above. The filter controller block 431 is configured to monitor the signal from the AM detector 429, and to generate a control signal 433 that adjusts the tunable reference filter 427 in a manner that maximizes the monitored signal from the AM detector 429. In accordance with one aspect of the invention, this same control signal 433 is also supplied to a control input of the tunable pre-selection filter 403. In the case of a homodyne receiver, this arrangement will cause the tunable pre-selection filter 403 to select (i.e., pass) those components of the received signal having the same frequency as the local oscillator signal. In the case of a low-IF receiver, this arrangement will cause the tunable pre-selection filter 403 to select (i.e., pass) those components of the received signal having a frequency that is slightly offset from the local oscillator frequency. This offset can be tolerable if the bandwidth of the filter is wide enough.

Because the tunable pre-selection filter 403 and the tunable reference filter 427 are preferably identical to one another, they will be well matched when manufactured on the same integrated circuit. Consequently, the control signal 433 is useful not only for tuning the tunable reference filter 427, but also for accurately tuning the tunable pre-selection filter 403. In this respect, the embodiment of FIG. 4 is similar to that described earlier with reference to FIG. 3. The embodiment of FIG. 4 has additional advantages, however, in that the signal supplied to the phase-shifting circuit 411 is filtered by the tunable reference filter 427, and is therefore improved with respect to phase noise. As a result, the VCO in the local oscillator circuit 425 can be made simpler (i.e., it can be designed to have a lower Q-value in the resonator). Alternatively, the VCO can be designed to consume less power. In some embodiments, designers might compromise their solutions, so that the VCO in the local oscillator circuit 425 is made somewhat simpler, while also having a VCO that consumes somewhat less power. Moreover, these advantages are achieved without adding any additional complexity to the overall receiver.

Figure 5:
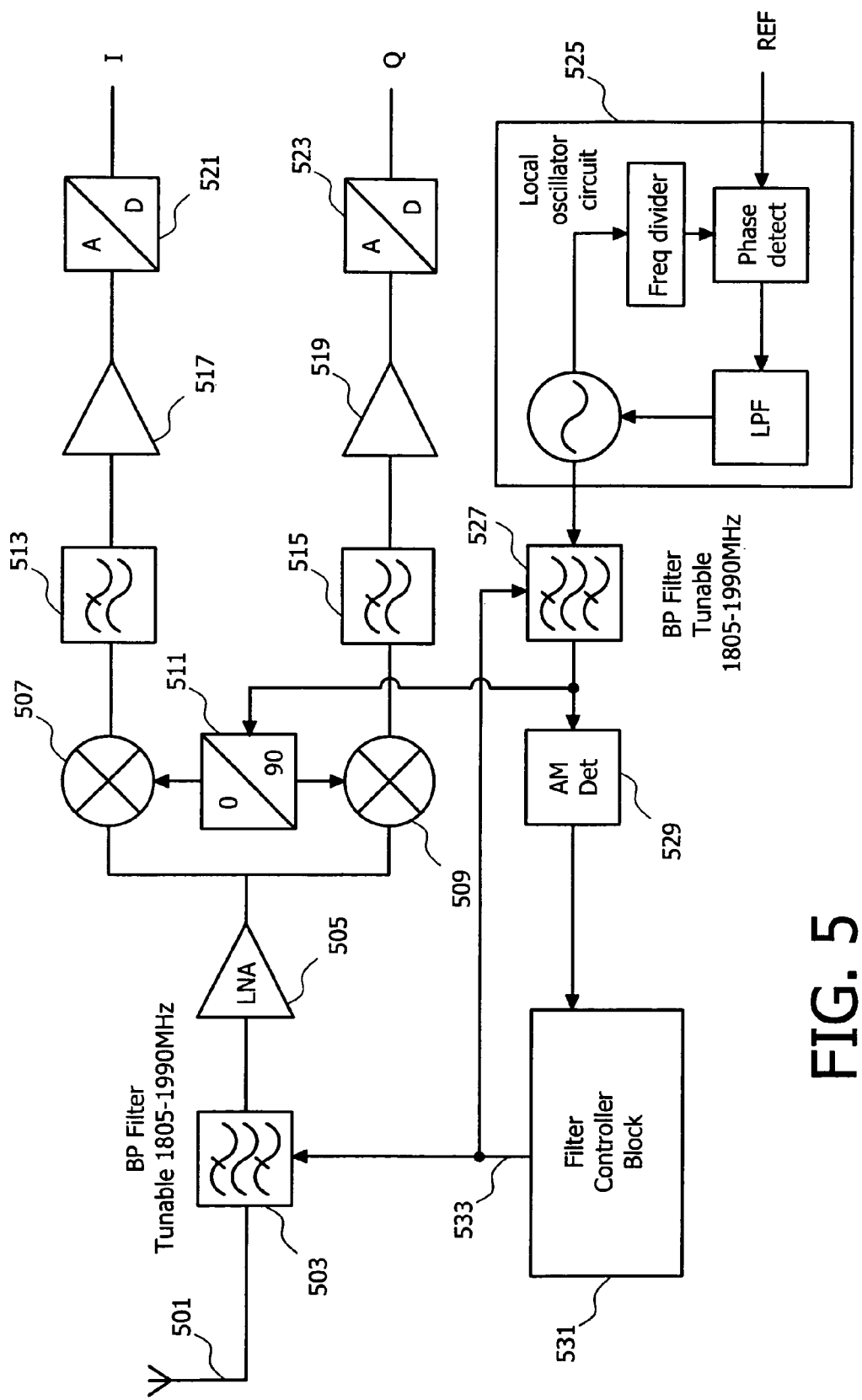
FIG. 5 is a block diagram of a dual band direct conversion radio receiver in accordance with the invention.

FIG. 5 is a block diagram of another exemplary embodiment of a receiver in accordance with the invention. The arrangement of FIG. 5 is similar to that of FIG. 4, but is designed to effect a dual band direct conversion radio receiver. Again, as used herein, the term "direct conversion" may alternatively mean a zero-IF receiver, or a low-IF receiver (i.e., a receiver whose IF is in the same range as the channel spacing). In operation, the exemplary receiver of FIG. 5 generates I and Q digital signals from a received RF signal. To accomplish this function, the RF signal is received by an antenna 501 and supplied to a tunable band-pass filter, herein referred to as a tunable pre-selection filter 503. The tunable pre-selection filter 503 is capable of tunably selecting channels within either of the desired frequency bands. In the exemplary embodiment, the desired frequency bands cover a combined range from 1805 to 1990 MHZ, so the tunable pre-selection filter 503 is tunable within this range.

From the output of the tunable pre-selection filter 503, the received signal is supplied to a low noise amplifier 505. After amplification, the signal is down-converted to respective in-phase (I) and quadrature (Q) baseband signals by first and second mixers 507, 509. This is accomplished by mixing the amplified received signal with respective locally-generated signals that each oscillate at (or near) the desired RF frequency, but which are 90 degrees out of phase with respect to one another. As indicated earlier, the purpose of separating the received signal into the I and Q baseband signals is to facilitate the demodulation of the signal (i.e., the extraction of the underlying information carried by the received signal). This aspect of the receiver operation is well-known, and need not be discussed here in further detail.

The respective locally-generated signals for use by the first and second mixers 507, 509 are created by first using a local oscillator circuit 525 to generate a signal of the desired frequency. The local oscillator circuit 525 is preferably implemented as a PLL. Like the embodiment of FIG. 4, the signal supplied by the local oscillator circuit 525 in the receiver of FIG. 5 is supplied to a second tunable band-pass filter, herein referred to as a tunable reference filter 527. The tunable reference filter 527 is preferably identical to the tunable pre-selection filter 503.

The output of the tunable reference filter 527 is supplied to a phase-shifting circuit 511 that shifts the phase of the locally-generated signal by 90 degrees. The original (non-shifted) signal may then be supplied to the first mixer 507, while the phase-shifted signal may be supplied to the second mixer 509.

After down-conversion, the I and Q baseband signals are supplied to respective first and second channel selection filters 513, 515. The purpose of the first and second channel selection filters 513, 515 is to further separate the received signal from the in-band interferers. In addition, the first and second channel selection filters 513, 515 may condition their respective input signals for the purpose of avoiding aliasing that can result from sampling that is performed by downstream analog-to-digital converters. A third possible use of the first and second channel selection filters 513, 515 is for channel filtering, although this could alternatively be performed digitally by downstream receiver components.

After channel selection, the resultant I and Q signals could be subjected to further filtering and amplification, e.g., by respective first and second amplifiers 517, 519. Because this exemplary embodiment is a digital environment, the resultant analog signals are converted into digital form by respective first and second analog-to-digital (A/D) converters 521, 523.

For good performance, it is necessary to accurately tune the tunable pre-selection filter 503 so that the desired channel will be selected. To accomplish this function, the signal supplied at the output of the tunable reference filter 527 is supplied to an AM detector 529. The output of the AM detector 529 is supplied to a filter controller block 531, which may be a hard-wired controller, a programmable controller executing a suitable set of program instructions, or any combination of the above. The filter controller block 531 is configured to monitor the signal from the AM detector 529, and to generate a control signal 533 that adjusts the tunable reference filter 527 in a manner that maximizes the monitored signal from the AM detector 529. In accordance with one aspect of the invention, this same control signal 533 is also supplied to a control input of the tunable pre-selection filter 503. In the case of a homodyne receiver, this arrangement will cause the tunable pre-selection filter 503 to select (i.e., pass) those components of the received signal having the same frequency as the local oscillator signal. In the case of a low-IF receiver, this arrangement will cause the tunable pre-selection filter 503 to select (i.e., pass) those components of the received signal having a frequency that is slightly offset from local oscillator frequency. This offset can be tolerable if the bandwidth of the filter is wide enough.

Because the tunable pre-selection filter 503 and the tunable reference filter 527 are preferably identical to one another, they will be well matched when manufactured on the same integrated circuit. Consequently, the control signal 533 is useful not only for tuning the tunable reference filter 527, but also for accurately tuning the tunable pre-selection filter 503. Like the embodiment of FIG. 4, the embodiment of FIG. 5 has advantages deriving from the fact that the signal supplied to the phase-shifting circuit 511 is filtered by the tunable reference filter 527, and is therefore improved with respect to phase noise. As a result, the VCO in the local oscillator circuit 525 can be made simpler (i.e., it can be designed to have a lower Q-value in the resonator). Alternatively, the VCO can be designed to consume less power. In some embodiments, designers might compromise their solutions, so that the VCO in the local oscillator circuit 425 is made somewhat simpler, while also having a VCO that consumes somewhat less power. Moreover, these advantages are achieved without adding any additional complexity to the overall receiver.

The embodiment of FIG. 5 has the further advantage of providing a single receiver that is capable of being used for two bands without having to add additional filters and front-end circuitry. Thus complexity and cost are reduced, compared to conventional receivers. In other alternative embodiments, the tunable pre-selection filter 503 and the tunable reference filter 527 can be designed to have an even wider range, spanning more than two frequency bands. Thus, a receiver can similarly be designed that is capable of multi-band operation.

Figure 6:
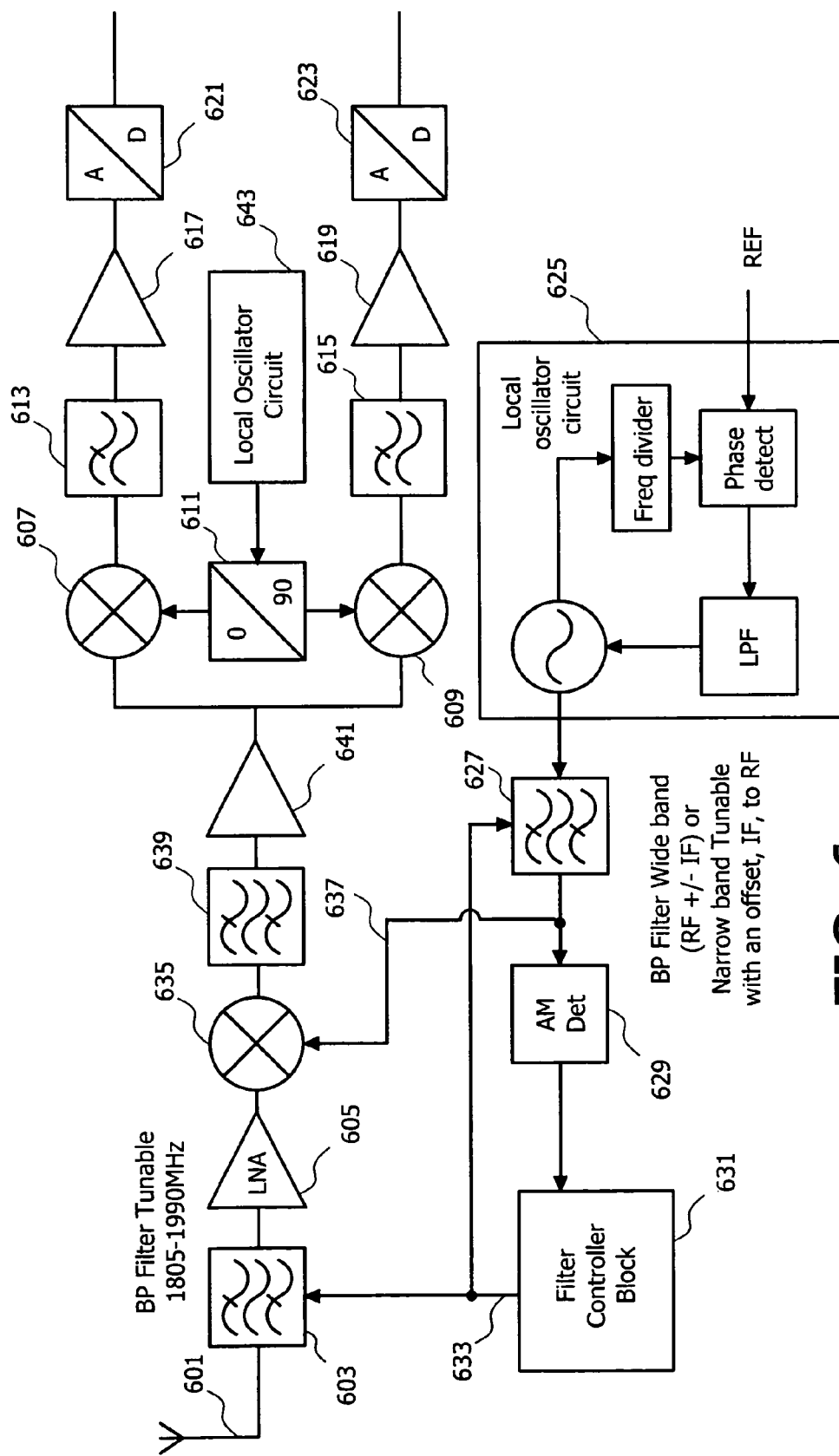
FIG. 6 is a block diagram of a dual band heterodyne receiver in accordance with the invention.

Turning now to yet another embodiment of the invention, FIG. 6 depicts a dual-band heterodyne receiver. Like the earlier described receivers, the exemplary receiver of FIG. 6 generates I and Q digital signals from a received RF signal. To accomplish this function, the RF signal is received by an antenna 601 and supplied to a tunable band-pass filter, herein referred to as a tunable pre-selection filter 603. The tunable pre-selection filter 603 is capable of tunably selecting channels within either of the desired frequency bands. In the exemplary embodiment, the desired frequency bands cover a combined range from 1805 to 1990 MHZ, so the tunable pre-selection filter 603 is tunable within this range.

From the output of the tunable pre-selection filter 603, the received signal is supplied to a low noise amplifier 605. After amplification, the signal is converted to an IF signal by an IF mixer 635, that mixes the amplified received signal with a first local oscillator signal 637. The frequency of the IF signal is related to the difference between the RF frequency and the frequency of the first local oscillator signal 637.

To create the first local oscillator signal 637, a first local oscillator circuit 625 generates a signal having a suitable frequency for mixing with the amplified RF signal. The first local oscillator circuit 625 is preferably implemented as a PLL. The signal generated by the first local oscillator circuit 625 is supplied to a second tunable band-pass filter, herein referred to as a tunable reference filter 627. In one embodiment, the tunable reference filter 627 is a narrow band-pass filter, having a center frequency that is offset with respect to the center frequency of the tunable pre-selection filter 603. The amount of the offset should be approximately the frequency of the IF signal to be generated. For example, if the intermediate frequency is 90 MHZ, then the offset should be approximately 90 MHZ.

The output of the IF mixer 635 is supplied to another band-pass filter 639. The band-pass filter 639 contributes to the overall channel selection filtering by suppressing noise outside the channel(s) of interest. Typically, the bandwidth of band-pass filter 639 is much smaller than the bandwidth of the tunable pre-selection filter 603. The output of the band-pass filter 639 is amplified by an IF amplifier 641, and then down-converted to respective in-phase (I) and quadrature (Q) baseband signals by first and second mixers 607, 609. This is accomplished by mixing the amplified received signal with respective locally-generated signals that each oscillate at (or near) the IF frequency, but which are 90 degrees out of phase with respect to one another. As indicated earlier, the purpose of separating the received signal into the I and Q baseband signals is to facilitate the demodulation of the signal (i.e., the extraction of the underlying information carried by the received signal). This aspect of the receiver operation is well-known, and need not be discussed here in further detail.

The respective locally-generated signals for use by the first and second mixers 607, 609 are created by first using a second local oscillator circuit 643 to generate a signal at or near the frequency of the IF signal. This signal is then supplied to a phase-shifting circuit 611 that shifts the phase of the locally-generated signal by 90 degrees. The original (non-shifted) signal may then be supplied to the first mixer 607, while the phase-shifted signal may be supplied to the second mixer 609.

After down-conversion, the I and Q baseband signals are supplied to respective first and second channel selection filters 613, 615. The purpose of the first and second channel selection filters 613, 615 is to further separate the received signal from the in-band interferers. In addition, the first and second channel selection filters 613, 615 may condition their respective input signals for the purpose of avoiding aliasing that can result from sampling that is performed by downstream analog-to-digital converters. A third possible use of the first and second channel selection filters 613, 615 is for channel filtering, although this could alternatively be performed digitally by downstream receiver components.

After channel selection, the resultant I and Q signals could be subjected to further filtering and amplification, e.g., by respective first and second amplifiers 617, 619. Because this exemplary embodiment is a digital environment, the resultant analog signals are converted into digital form by respective first and second analog-to-digital (A/D) converters 621, 623.

For good performance, it is necessary to accurately tune the tunable pre-selection filter 603 so that the desired channel will be selected. To accomplish this function, the signal supplied at the output of the tunable reference filter 627 is further supplied to an AM detector 629. The output of the AM detector 629 is supplied to a filter controller block 631, which may be a hard-wired controller, a programmable controller executing a suitable set of program instructions, or any combination of the above. The filter controller block 631 is configured to monitor the signal from the AM detector 629, and to generate a control signal 633 that adjusts the tunable reference filter 627 in a manner that maximizes the monitored signal from the AM detector 629. In accordance with one aspect of the invention, this same control signal 633 is also supplied to a control input of the tunable pre-selection filter 603. This arrangement will cause the tunable pre-selection filter 603 to select (i.e., pass) those components of the received signal having the frequency of the desired RF signal.

Because the tunable pre-selection filter 603 and the tunable reference filter 627 are preferably manufactured on the same integrated circuit, they will be well matched with respect to one another. Consequently, the control signal 633 is useful not only for tuning the tunable reference filter 627, but also for accurately tuning the tunable pre-selection filter 603.

In an alternative embodiment, the tunable reference filter 627 may be a wider band-pass filter, with a bandwidth at least as wide as the offset frequency between the local oscillator and the desired RF signal. In this case, the filter bandwidth should be wide enough to avoid attenuation of both the signal from the first local oscillator circuit 625 and the desired RF signal, when the center frequency of the filter is tuned to exactly between the local oscillator frequency and the desired RF signal. For example, if the intermediate frequency is 90 MHZ, the bandwidth of the tunable reference filter 627 should be at least 90 MHZ.

In this embodiment, the tuning of the tunable pre-selection filter 603 is again based on the same signal that tunes the tunable reference filter 627. However, in this case the filter controller block 631 does not attempt to maximize the signal supplied at the output of the AM detector 629. Instead, tuning starts by initially setting the tunable reference filter 627 to a frequency that is alternatively higher or lower than the expected frequency band of the filter. At this point, no detectable signal should be supplied by the AM detector 629. Then, the tunable reference filter 627 is adjusted down or up (depending on the initial setting) until the filter control block 631 senses a detectable signal from the AM detector 629. At this point, the tunable reference filter 627 as well as the tunable pre-selection filter 603 are tuned.

For example, consider a case in which the frequency of the local oscillator circuit 625 is higher than the RF frequency. If the tunable reference filter 627 is initially set to a frequency lower than the RF frequency, no detectable signal is supplied by the AM detector 629. The pass-band of the tunable reference filter 627 is then adjusted upward by the filter controller block 631 until the filter controller block 631 senses a detectable signal at the output of the AM detector 629. At this point, the signal from the local oscillator circuit 625 will be in the high part of the tunable reference filter's pass-band, while the RF signal will be in the low part of this pass-band.

In another example, the frequency of the local oscillator circuit 625 may be lower than the RF frequency. In this case, the tunable reference filter 627 is initially set to a frequency higher than the RF frequency, so that no detectable signal is supplied by the AM detector 629. The pass-band of the tunable reference filter 627 is then adjusted downward by the filter controller block 631 until the filter controller block 631 senses a detectable signal at the output of the AM detector 629. At this point, the signal from the local oscillator circuit 625 will be in the low part of the tunable reference filter's pass-band, while the RF signal will be in the high part of this pass-band.

Like earlier embodiments, all of the embodiments illustrated by FIG. 6 have the advantage of providing a single receiver that is capable of being used for two bands without having to add additional filters and front-end circuitry. Thus complexity and cost are reduced, compared to conventional receivers. In other alternative embodiments, the tunable pre-selection filter 603 and the tunable reference filter 627 can be designed to have an even wider range, spanning more than two frequency bands. Thus, a receiver can similarly be designed that is capable of multi-band operation.

Figure 7:
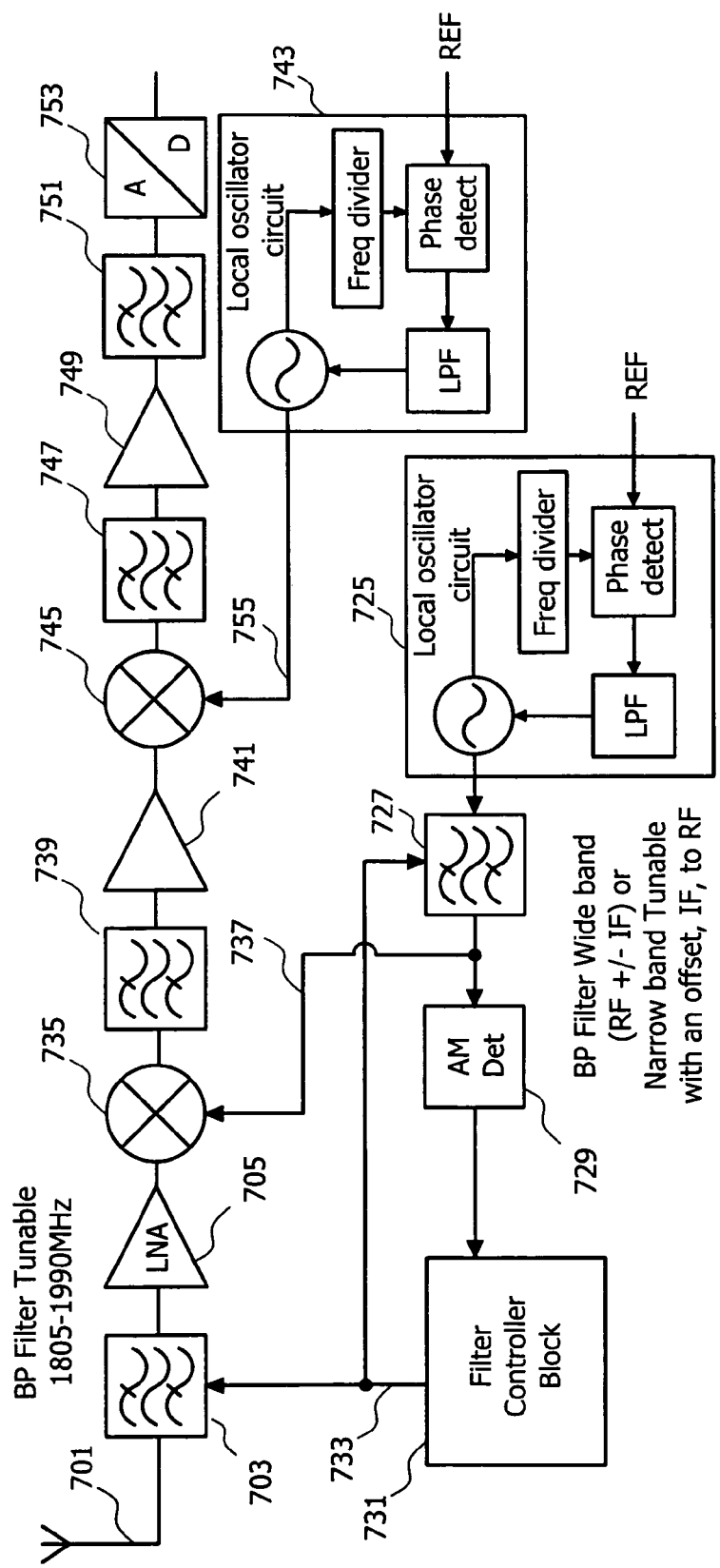
FIG. 7 is a block diagram of a dual-band double super-heterodyne receiver in accordance with the invention.

Turning now to yet another embodiment of the invention, FIG. 7 depicts a dual-band double superheterodyne receiver. Unlike the earlier described receivers, the exemplary receiver of FIG. 7 does not generate I and Q digital signals from a received RF signal. Instead, it generates digital samples directly from an intermediate frequency signal. To accomplish this function, the RF signal is received by an antenna 701 and supplied to a tunable band-pass filter, herein referred to as a tunable pre-selection filter 703. The tunable pre-selection filter 703 is capable of tunably selecting channels within either of the desired frequency bands. In the exemplary embodiment, the desired frequency bands cover a combined range from 1805 to 1990 MHZ, so the tunable pre-selection filter 703 is tunable within this range.

From the output of the tunable pre-selection filter 703, the received signal is supplied to a low noise amplifier 705. After amplification, the signal is converted to a first IF signal by a first IF mixer 735, that mixes the amplified received signal with a first local oscillator signal 737. The frequency of the first IF signal is related to the difference between the RF frequency and the frequency of the first local oscillator signal 737.

To create the first local oscillator signal 737, a first local oscillator circuit 725 generates a signal having a suitable frequency for mixing with the amplified RF signal. The first local oscillator circuit 725 is preferably implemented as a PLL. The signal generated by the first local oscillator circuit 725 is supplied to a second tunable band-pass filter, herein referred to as a tunable reference filter 727. In one embodiment, the tunable reference filter 727 is a narrow band-pass filter, having a center frequency that is offset with respect to the center frequency of the tunable pre-selection filter 703. The amount of the offset should be approximately the frequency of the first IF signal to be generated. For example, if the first intermediate frequency is 90 MHZ, then the offset should be approximately 90 MHZ.

The output of the first IF mixer 735 is supplied to another band-pass filter 739. The band-pass filter 739 contributes to the overall channel selection filtering by suppressing noise outside the channel(s) of interest. Typically, the bandwidth of band-pass filter 739 is much smaller than the bandwidth of the tunable pre-selection filter 703. The output of the band-pass filter 739 is amplified by a first IF amplifier 741 and then down-converted to a second intermediate frequency by means of a second mixer 745, that mixes the amplified first IF signal with a second local oscillator signal 755. The frequency of the second IF signal is related to the difference between the first IF frequency and the frequency of the second local oscillator signal 755.

To create the second local oscillator signal 755, a second local oscillator circuit 743 generates a signal having a suitable frequency for mixing with the amplified first IF signal. The second local oscillator circuit 743 is preferably implemented as a PLL.

The second IF signal, supplied by the second mixer 745, is then processed by yet another band-pass filter 747. The resultant signal is then further amplified by an amplifier 749 and again filtered by still another band-pass filter 751. The band-pass filters 747 and 751 perform further channel selection filtering. Only one of these channel selection filters need be employed if the overall channel performance requirements permit, or if a sufficiently high-performance channel selection filter is employed. The signal at the output of this band-pass filter 751, which is at the second IF frequency, is then converted to a digital form by an A/D converter 753.

For good performance, it is necessary to accurately tune the tunable pre-selection filter 703 so that the desired channel will be selected. To accomplish this function, the signal supplied at the output of the tunable reference filter 727 is further supplied to an AM detector 729. The output of the AM detector 729 is supplied to a filter controller block 731, which may be a hard-wired controller, a programmable controller executing a suitable set of program instructions, or any combination of the above. The filter controller block 731 is configured to monitor the signal from the AM detector 729, and to generate a control signal 733 that adjusts the tunable reference filter 727 in a manner that maximizes the monitored signal from the AM detector 729. In accordance with one aspect of the invention, this same control signal 733 is also supplied to a control input of the tunable pre-selection filter 703. This arrangement will cause the tunable pre-selection filter 703 to select (i.e., pass) those components of the received signal having the frequency of the desired RF signal.

Because the tunable pre-selection filter 703 and the tunable reference filter 727 are preferably manufactured on the same integrated circuit, they will be well matched with respect to one another. Consequently, the control signal 733 is useful not only for tuning the tunable reference filter 727, but also for accurately tuning the tunable pre-selection filter 703.

In an alternative embodiment, the tunable reference filter 727 may be a wider band-pass filter, with a bandwidth at least as wide as the offset frequency between the local oscillator and the desired RF signal. In this case, the filter bandwidth should be wide enough to avoid attenuation of both the signal from the first local oscillator circuit 725 and the desired RF signal, when the center frequency of the filter is tuned to a frequency exactly between the local oscillator frequency and the desired RF signal. For example, if the first intermediate frequency is 90 MHZ, the bandwidth of the tunable reference filter 727 should be at least 90 MHZ.

In this embodiment, the tuning of the tunable pre-selection filter 703 is again based on the same signal that tunes the tunable reference filter 727. However, in this case the filter controller block 731 does not attempt to maximize the signal supplied at the output of the AM detector 729. Instead, tuning starts by initially setting the tunable reference filter 727 to a frequency that is alternatively higher or lower than the expected frequency band of the filter. At this point, no detectable signal should be supplied by the AM detector 729. Then, the tunable reference filter 727 is adjusted down or up (depending on the initial setting) until the filter control block 731 senses a detectable signal from the AM detector 729. At this point, the tunable reference filter 727 as well as the tunable pre-selection filter 703 are tuned.

For example, consider a case in which the frequency of the first local oscillator circuit 725 is higher than the RF frequency. If the tunable reference filter 727 is initially set to a frequency lower than the RF frequency, no detectable signal is supplied by the AM detector 729. The pass-band of the tunable reference filter 727 is then adjusted upward by the filter controller block 731 until the filter controller block 731 senses a detectable signal at the output of the AM detector 729. At this point, the signal from the first local oscillator circuit 725 will be in the high part of the tunable reference filter's pass-band, while the RF signal will be in the low part of this pass-band.

In another example, the frequency of the first local oscillator circuit 725 may be lower than the RF frequency. In this case, the tunable reference filter 727 is initially set to a frequency higher than the RF frequency, so that no detectable signal is supplied by the AM detector 729. The pass-band of the tunable reference filter 727 is then adjusted downward by the filter controller block 731 until the filter controller block 731 senses a detectable signal at the output of the AM detector 729. At this point, the signal from the first local oscillator circuit 725 will be in the low part of the tunable reference filter's pass-band, while the RF signal will be in the high part of this pass-band.

Like earlier embodiments, all of the embodiments illustrated by FIG. 7 have the advantage of providing a single receiver that is capable of being used for two bands without having to add additional filters and front-end circuitry. Thus complexity and cost are reduced, compared to conventional receivers. In other alternative embodiments, the tunable pre-selection filter 703 and the tunable reference filter 727 can be designed to have an even wider range, spanning more than two frequency bands. Thus, a receiver can similarly be designed that is capable of multi-band operation.

In each of the exemplary embodiments described above, the tunable reference filter has been illustrated as a separate component, distinct from other illustrated components. However, for those embodiments that employ direct conversion of the RF signal to a baseband signal (e.g., embodiments described above with reference to any of FIGS. 3, 4 or 5), the tunable reference filter may be implemented as a part of the local oscillator circuit. This derives from the fact that the resonator in a local oscillator behaves like a band-pass filter. In such embodiments, the benefits of the invention can be achieved without having to introduce additional parts associated with the tunable reference filter and/or the AM detector and filter controller block components.

Figure 8:
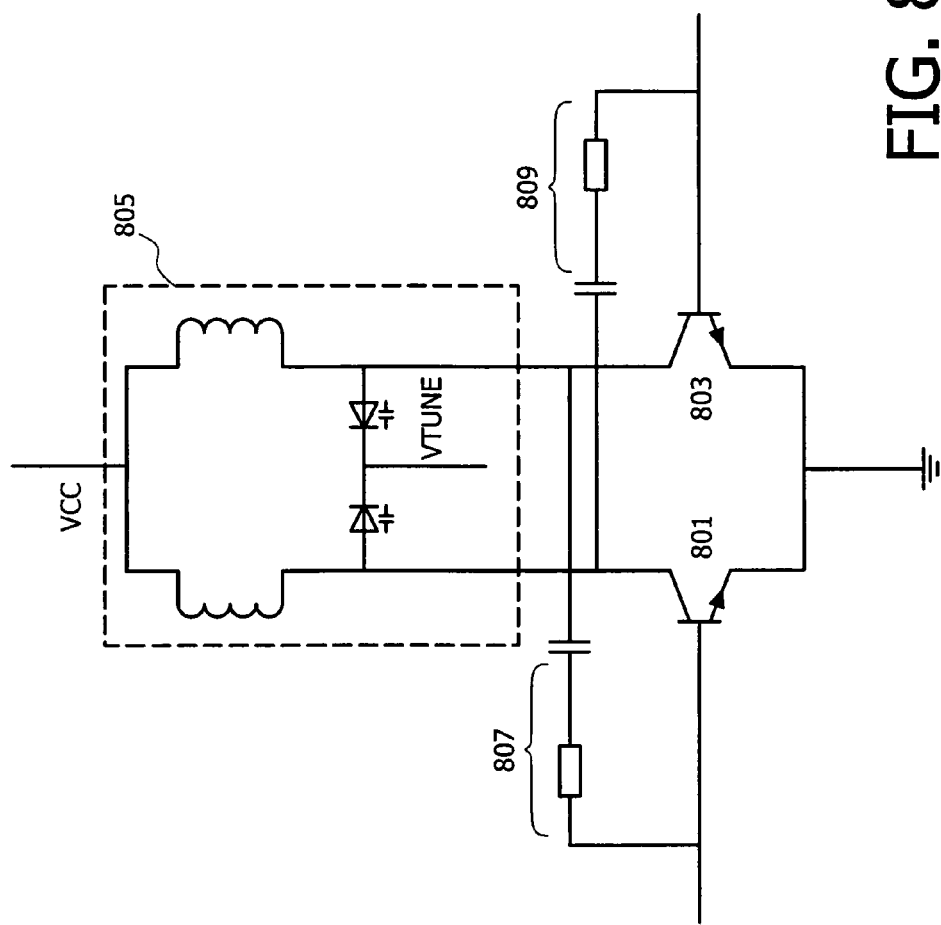
FIG. 8 is a circuit diagram of a VCO having a tunable resonator.

For example, FIG. 8 depicts a VCO having a pair of input transistors 801, 803 that are coupled in a feedback configuration through passive R/C networks 807 and 809. The circuit further comprises a tunable resonator 805 that operates as a band-pass filter. While a specific VCO topology has been depicted, it will be understood that any conventional VCO configuration may be employed, provided the tunable resonator 805 may be incorporated into the chosen design. Furthermore, the biasing of such circuits is well-known, and need not be discussed here in further detail.

The tuned resonator VCO topology shown in FIG. 8 may be used in any of the local oscillator circuits 325, 425, 525 shown in FIGS. 3, 4, or 5. Each of the local oscillator circuits 325, 425, 525 are preferably implemented as PLLs. A control signal VTUNE is generated by a respective PLL and is used to bias the tunable resonator 805 of the tuned resonator VCO causing the local oscillator circuits to produce a locally generated signal at (or near) the desired RF frequency.

The tunable resonator 805 is preferably identical to any of the tunable pre-selection filters 303, 403, 503, and will generally be well matched to the pre-selection filters when manufactured on the same component (i.e., the same IC). The generated control signal VTUNE used for tuning the tuned resonator VCO may then be used for tuning the pre-selection filters 303, 403, 503 to achieve the same filtering characteristic. Thus, the tuned resonator VCO may be used to reduce the overall component count for the direct conversion radio receivers shown in FIGS. 3, 4, and 5 by eliminating the need for the AM detector and filter controller block components.

Figure 9:
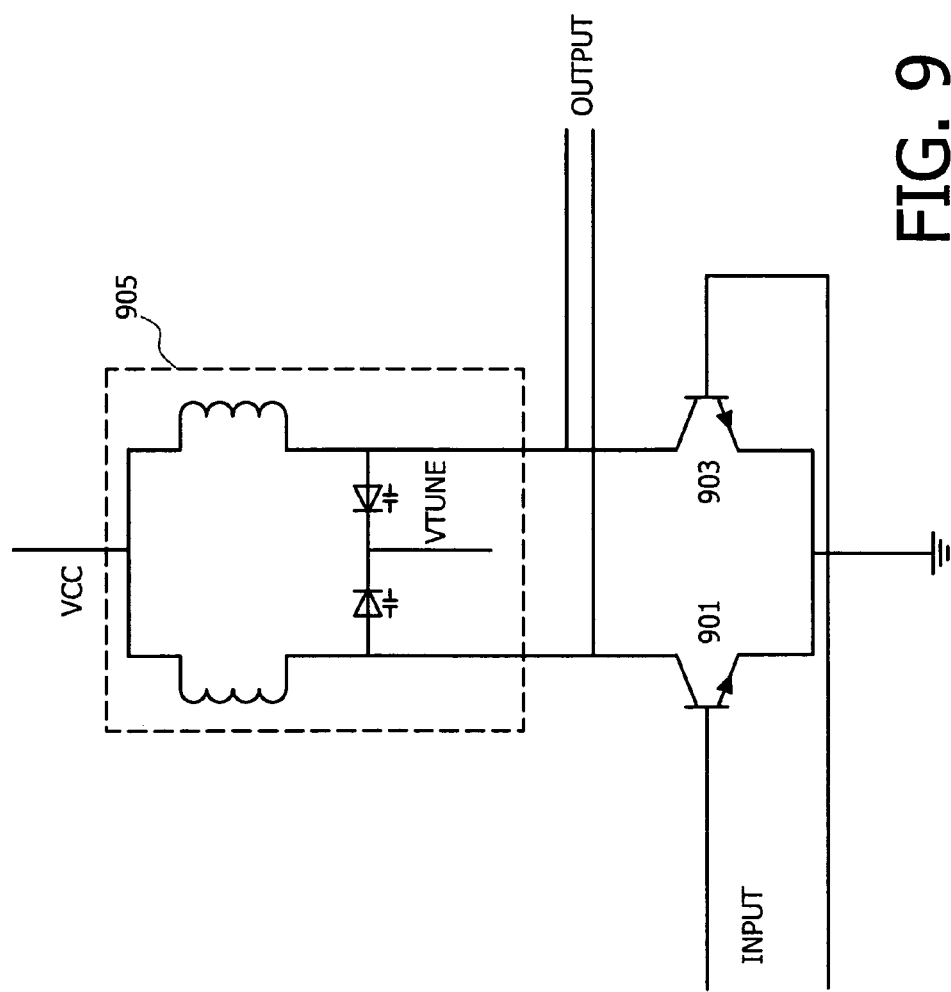
FIG. 9 is a circuit diagram of an amplifier stage having a tunable load.

To further reduce the radio receiver component count and increase the overall level of integration in the receiver, the need for the separate tunable pre-selection filters 303, 403, 503 shown in FIGS. 3, 4, and 5 may be eliminated by either completely, or partially, incorporating the pre-selection filter function into any of the low noise amplifiers 305, 405, 505. Such a tunable low noise amplifier is shown in FIG. 9. The tunable amplifier comprises a pair of input transistors 901, 903 that are coupled to a tunable load impedance 905. The tunable load impedance 905 operates as a band-pass filter, passing only those amplified input signals to the output terminals of the amplifier that are at (or near) the desired RF frequency.

The filtering characteristics of the tunable amplifier may be adjusted by changing a control signal input VTUNE. The tunable load impedance 905 is preferably identical to tunable resonator 805, and will generally be well matched to the resonator 805 when manufactured on the same component (i.e., the same IC). The control signal VTUNE generated by a respective local oscillator circuit 325, 425, 525 using a tuned resonator VCO is preferably coupled to the control signal input VTUNE of the tunable amplifier. This arrangement will cause the tunable amplifier to select (i.e., pass) those components of the received signal having the same frequency as the corresponding generated local oscillator signal. Thus, by employing a tunable amplifier in combination with a matched tuned resonator VCO, the desired channel selection in the receiver can be achieved without the need for having a separate tunable pre-selection filter, AM detector, or filter controller block.

Figure 10:
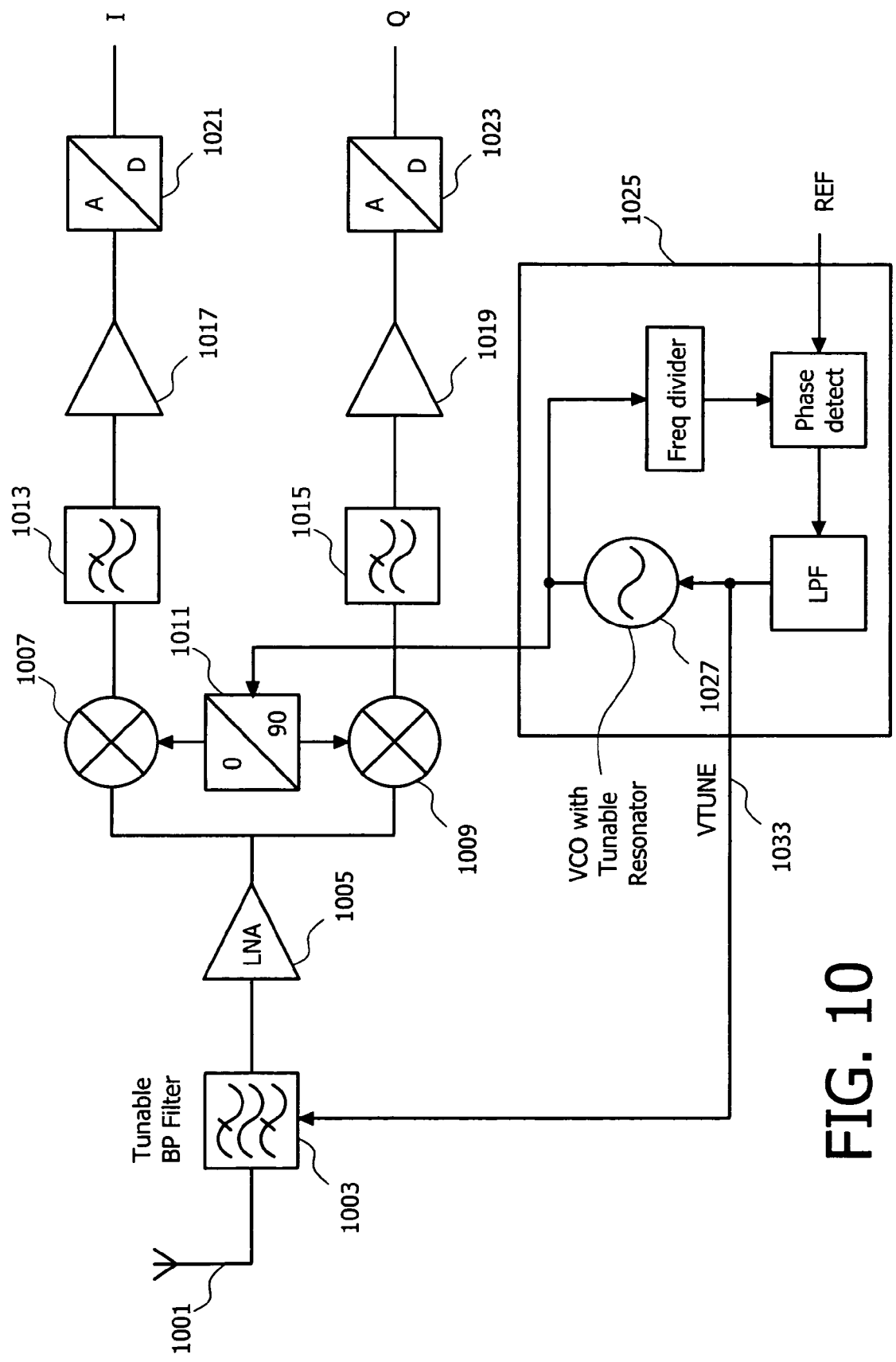
FIG. 10 is block diagram of a single-band direct conversion radio receiver utilizing a tuned resonator VCO.

Various exemplary embodiments of radio receivers using tuned resonator VCOs and tunable low noise amplifiers as described above will now be presented. Referring first to FIG. 10, this is a block diagram of a single-band direct conversion radio receiver utilizing a tuned resonator VCO 1027 as shown in FIG. 8. Again, as used herein, the term "direct conversion" may alternatively mean a zero-IF receiver, or a low-IF receiver (i.e., a receiver whose IF is in the same range as the channel spacing). As in the earlier presented embodiments, in-phase (I) and quadrature (Q) digital signals are generated from a received RF signal. To accomplish this function, the RF signal is received by an antenna 1001 and supplied to a tunable band-pass filter, herein referred to as a tunable pre-selection filter 1003. The tunable pre-selection filter 1003 is capable of tunably selecting channels within the desired frequency band.

From the output of the tunable pre-selection filter 1003, the received signal is supplied to a low noise amplifier 1005. After amplification, the signal is down-converted to respective I and Q baseband signals by first and second mixers 1007, 1009. This is accomplished by mixing the amplified received signal with respective locally-generated signals that each oscillate at (or near) the desired RF frequency, but which are 90 degrees out of phase with respect to one another. As indicated earlier, the purpose of separating the received signal into the I and Q baseband signals is to facilitate the demodulation of the signal (i.e., the extraction of the underlying information carried by the received signal). This aspect of the receiver operation is well-known, and need not be discussed here in further detail.

The respective locally-generated signals for use by the first and second mixers 1007, 1009 are created by first using a local oscillator circuit 1025 to generate a signal of the desired frequency. The local oscillator circuit is preferably implemented as a PLL. This embodiment differs from the previously presented embodiments in that the local oscillator circuit 1025 comprises a VCO 1027 having a tunable resonator (not shown). The tunable resonator of the VCO 1027 is preferably identical to the tunable pre-selection filter 1003. A control signal VTUNE 1033 generated by the local oscillator circuit 1025 is used to bias the tunable resonator of the VCO 1027, thereby causing the local oscillator circuit 1025 to produce a locally generated signal at (or near) the desired RF frequency.

This signal produced by the local oscillator circuit 1025 is supplied to a phase-shifting circuit 1011 that shifts the phase of the locally-generated signal by 90 degrees. The original (non-shifted) signal may then be supplied to the first mixer 1007, while the phase-shifted signal may be supplied to the second mixer 1009.

After down-conversion, the I and Q baseband signals are supplied to respective first and second channel selection filters 1013, 1015. The purpose of the first and second channel selection filters 1013, 1015 is to further separate the received signal from the in-band interferers. In addition, the first and second channel selection filters 1013, 1015 may condition their respective input signals for the purpose of avoiding aliasing that can result from sampling that is performed by downstream analog-to-digital converters. A third possible use of the first and second channel selection filters 1013, 1015 is for channel filtering, although this could alternatively be performed digitally by downstream receiver components.

After channel selection, the resultant I and Q signals could be subjected to further filtering and amplification, e.g., by respective first and second amplifiers 1017, 1019. Because this exemplary embodiment is a digital environment, the resultant analog signals are converted into digital form by respective first and second analog-to-digital (AND) converters 1021, 1023.

For good performance of the radio receiver, it is necessary to accurately tune the tunable pre-selection filter 1003 so that the desired channel will be selected. To accomplish this function, the control signal VTUNE 1033 generated by the local oscillator circuit 1025 and used to tune the tunable resonator of VCO 1027 is, in accordance with one aspect of the invention, also supplied to a control input of the tunable pre-selection filter 1003. In the case of a homodyne receiver, this arrangement will cause the tunable pre-selection filter 1003 to select (i.e., pass) those components of the received signal having the same frequency as the local oscillator signal. In the case of a low-IF receiver, this arrangement will cause the tunable pre-selection filter 1003 to select (i.e., pass) those components of the received signal having a frequency that is slightly offset from the local oscillator frequency. This offset can be tolerable if the bandwidth of the filter is wide enough.

Because the tunable pre-selection filter 1003 and the tunable resonator of the VCO 1027 are preferably identical to one another, they will be well matched when manufactured on the same IC. Consequently, the control signal 1033 is useful not only for biasing the tunable resonator of the VCO 1027 so that the local oscillator circuit 1025 produces a locally generated signal at (or near) the desired RF frequency, but also for accurately tuning the tunable pre-selection filter 1003. In this respect, the embodiment of FIG. 10 is similar to those embodiments described earlier with reference to FIGS. 3, 4, and 5. The embodiment of FIG. 10 has additional advantages, however, in that the overall component count for the radio receiver is reduced by eliminating the need for the AM detector and filter controller block components.

Figure 11:
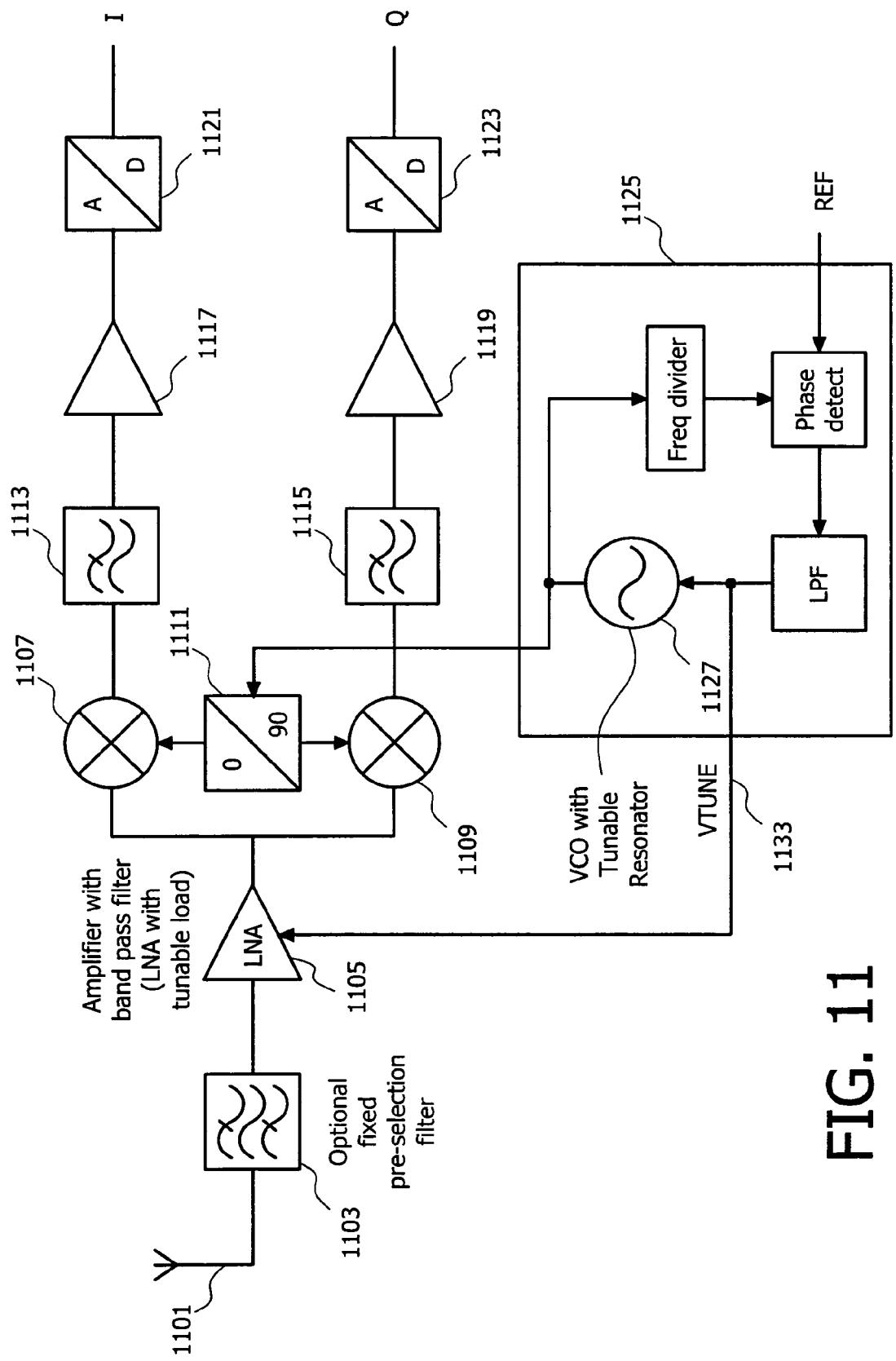
FIG. 11 is block diagram of a single-band direct conversion radio receiver utilizing a tuned resonator VCO and a low noise amplifier having a tunable load.

FIG. 11 shows a block diagram of another exemplary embodiment of a receiver in accordance with the invention. The arrangement of FIG. 11 is similar to that of FIG. 10 in that the local oscillator circuits 1025, 1125 in the embodiments each employ a VCO 1027, 1127 having a tunable resonator (not shown). Unlike the receiver of FIG. 10, however, the arrangement of FIG. 11 incorporates the pre-selection filter function performed by the tunable band-pass filter 1003 of FIG. 10 into a low noise amplifier 1105 with a tunable load impedance (not shown). Like the tunable pre-selection filter 1003 of FIG. 10, the low noise amplifier 1105 with a tunable load impedance is capable of tunably selecting channels within the desired frequency band.

As in the earlier presented embodiments, I and Q digital signals are generated from a received RF signal. To accomplish this function, the RF signal is received by an antenna 1101 and then is either supplied to an optional fixed pre-selection band-pass filter 1103 and then to a low noise amplifier 1105 having a tunable load impedance (not shown), or directly to the low noise amplifier 1105. The low noise amplifier 1105 with tunable load impedance operates either as the sole pre-selection filter in the radio receiver, or as an additional pre-selection filter in the receiver, that is capable of tunably selecting channels within the desired frequency band. Inclusion of the optional fixed pre-selection filer 1103 in the signal path eases the design constraints placed on the low noise amplifier 1105, and reduces the overall complexity of the amplifier.

After amplification, the signal is down-converted to respective I and Q baseband signals by first and second mixers 1107, 1109. This is again accomplished by mixing the amplified received signal with respective locally-generated signals that each oscillate at (or near) the desired RF frequency, but which are 90 degrees out of phase with respect to one another. As indicated earlier, the purpose of separating the received signal into the I and Q baseband signals is to facilitate the demodulation of the signal (i.e., the extraction of the underlying information carried by the received signal). This aspect of the receiver operation is well-known, and need not be discussed here in further detail.

The respective locally-generated signals for use by the first and second mixers 1107, 1109 are created by first using a local oscillator circuit 1125 to generate a signal of the desired frequency. The local oscillator circuit is preferably implemented as a PLL. As in the radio receiver depicted in FIG. 10, the local oscillator circuit 1125 comprises a VCO 1127 having a tunable resonator (not shown). The tunable resonator of the VCO 1127 is preferably identical to the tunable load impedance of the low noise amplifier 1105. A control signal VTUNE 1133 generated by the local oscillator circuit 1125 is used to bias the tunable resonator of the VCO 1127, thereby causing the local oscillator circuit 1125 to produce a locally generated signal at (or near) the desired RF frequency.

This signal produced by the local oscillator circuit 1125 is supplied to a phase-shifting circuit 1111 that shifts the phase of the locally-generated signal by 90 degrees. The original (non-shifted) signal may then be supplied to the first mixer 1107, while the phase-shifted signal may be supplied to the second mixer 1109.

After down-conversion, the I and Q baseband signals are supplied to respective first and second channel selection filters 1113, 1115. The purpose of the first and second channel selection filters 1113, 1115 is to further separate the received signal from any in-band interferers that may be present in the baseband signals. In addition, the first and second channel selection filters 1113, 1115 may condition their respective input signals for the purpose of avoiding aliasing that can result from sampling that is performed by downstream analog-to-digital converters. A third possible use of the first and second channel selection filters 1113, 1115 is for channel filtering, although this could alternatively be performed digitally by downstream receiver components.

After channel selection, the resultant I and Q signals could be subjected to further filtering and amplification, e.g., by respective first and second amplifiers 1117, 1119. Because this exemplary embodiment is a digital environment, the resultant analog signals are converted into digital form by respective first and second analog-to-digital (A/D) converters 1121, 1123.

For good performance of the radio receiver, it is necessary to accurately tune the tunable load impedance of the low noise amplifier 1105 so that only those signals with the desired channel will be selected. To accomplish this function, the control signal VTUNE 1133 generated by the local oscillator circuit 1125 and used to tune the supplied to a control input VTUNE (not shown) of the low noise amplifier 1105. In the case of a homodyne receiver, this arrangement will cause the low noise amplifier 1103 to select (i.e., pass) those amplified components of the received signal having the same frequency as the local oscillator signal. In the case of a low-IF receiver, this arrangement will cause the low noise amplifier 1105 to select (i.e., pass) those amplified components of the received signal having a frequency that is slightly offset from the local oscillator frequency. This offset can be tolerable if the bandwidth of the tunable load impedance is wide enough.

Because the tunable load impedance of the low noise amplifier 1105 and the tunable resonator of the VCO 1127 are preferably identical to one another, they will be well matched when manufactured on the same IC. Consequently, the control signal 1133 is useful not only for biasing the tunable resonator of the VCO 1127 so that the local oscillator circuit 1125 produces a locally generated signal at (or near) the desired RF frequency, but also for accurately tuning the tunable load impedance of the low noise amplifier 1105. In this respect, the embodiment of FIG. 11 is similar to that of FIG. 10. The embodiment of FIG. 11 has the additional advantage, however, in that in addition to eliminating the need for the AM detector and filter controller block components, the complexity and component count of the radio receiver shown in FIG. 11 is further reduced by eliminating the need for a separate tunable pre-selection filter, such as the tunable pre-selection filter 1003 shown in FIG. 10.

Figure 12:
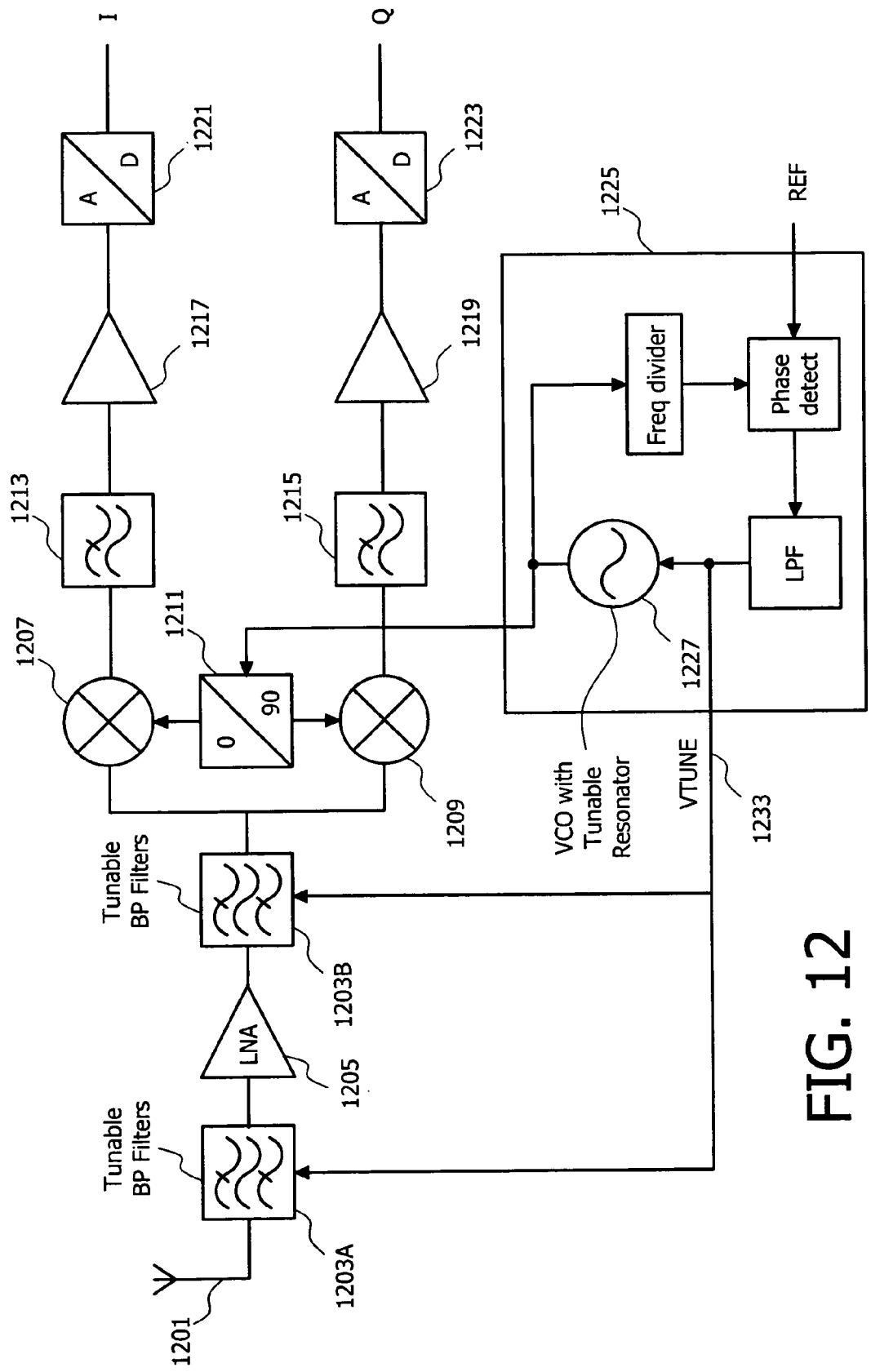
FIG. 12 is block diagram of a single-band direct conversion radio receiver utilizing a tuned resonator VCO and dual pre-selection filters.

Yet another exemplary embodiment of a single-band direct conversion radio receiver utilizing a VCO having a tuned resonator is shown in FIG. 12. The configuration of this radio receiver is substantially the same as the receiver shown in FIG. 10 with the exception that the tunable pre-selection filter 1003 of FIG. 10 is replaced by two tunable pre-selection filters 1203A, 1203B. As such, with the exception of the operation of these tunable pre-selection filters 1203A, 1203B, the reader is directed to those portions of the written description discussing the radio receiver of FIG. 10, to obtain a detailed description of the function and interaction of those components common to the radio receivers of FIGS. 10 and 12.

To achieve the desired degree of channel selectivity from a pre-selection filter, it is necessary that the filter be designed to have as little loss as possible. Designing these low-loss filters to have the required degree of sensitivity is often difficult to do. To avoid the need for such a low-loss filter, it is preferable to divide the overall filter response among a number of pre-selection filters, each filter in turn requiring a somewhat higher amount loss than would be required of a corresponding single pre-selection filter.

The radio receiver configuration shown in FIG. 12 utilizes this principle by dividing the overall channel selection functionality of tunable pre-selection filter 1003 of FIG. 10 among two tunable pre-selection filters 1203A, 1203B. The first of these tunable pre-selection filters 1203A operates on the RF signal that is received at the antenna 1201. The first tunable pre-selection filter 1203A is capable of tunably selecting channels within the desired frequency band. From the output of the first tunable pre-selection filter 1203A, the received signal is supplied to a low noise amplifier 1205. After amplification, the partially filtered RF signal is supplied to the second tunable pre-selection filter 1203B. The second tunable pre-selection filter 1203B is also capable of tunably selecting channels within the desired frequency band. After channel selection filtering, the signal is downconverted to respective I and Q baseband signals in the same manner as described in conjunction with the radio receiver shown in FIG. 10.

For good performance of the radio receiver, it is necessary to accurately tune the first and second tunable pre-selection filters 1203A, 1203B so that only those signals with the desired channel will be selected. To accomplish this function, the control signal VTUNE 1233 generated by the local oscillator circuit 1225 and used to tune the tunable resonator of VCO 1227 is, in accordance with one aspect of the invention, also supplied to a control input VTUNE (not shown) of each of the first and second tunable pre-selection filters 1203A, 1203B. In the case of a homodyne receiver, this arrangement will cause the first and second pre-selection filters 1203A, 1203B to select (i.e., pass) those components of the received signal having the same frequency as the local oscillator signal. In the case of a low-IF receiver, this arrangement will cause the first and second pre-selection filters 1203A, 1203B to select (i.e., pass) those components of the received signal having a frequency that is slightly offset from the local oscillator frequency. This offset can be tolerable if the bandwidth of the tunable load impedance is wide enough.

It is preferable that first pre-selection filter 1203A, the second pre-selection filter 1203B, and the tunable resonator of the VCO 1227 be identical to one another such that these components will be well matched when manufactured on the same IC. Consequently, the control signal 1233 is useful not only for biasing the tunable resonator of the VCO 1227 so that the local oscillator circuit 1225 produces a locally generated signal at (or near) the desired RF frequency, but also for accurately tuning the first and second tunable pre-selection filters 1203A, 1203B. As with the embodiment shown in FIG. 10, the embodiment of FIG. 12 has the advantage of eliminating the need for the AM detector and filter controller block components required in some of the previously described embodiments. In addition, neither of the tunable pre-selection filters 1203A, 1203B shown in FIG. 12 need be designed to have as low a loss characteristic as is required of the single tunable pre-selection filter 1003 shown in FIG. 10.

The various exemplary embodiments of radio receivers shown in FIGS. 10, 11, and 12 utilizing tuned resonator VCOs and tunable low noise amplifiers have been presented as single-band receivers. It will be understood the concepts described in conjunction with these exemplary embodiments can be applied to produce dual-band direct conversion radio receivers by appropriately adjusting the bandwidths of the tuned resonator VCOs, tunable low noise amplifiers, and tunable pre-selection filters presented in these embodiments.

Each of the above-described exemplary embodiments illustrate a "replica-biasing" approach to tuning the front-end pre-selection filters of a radio receiver. In each the embodiments, a tunable reference filter (or replica) is first tuned to a specific filter response using a bias signal. Then, the same bias signal is used to tune the response of a corresponding pre-selection filter. The tunable pre-selection and reference filters are preferably matched, so that the bias signal used for tuning one of the filters (e.g., the replica reference filter) will also accurately tune the other filter (e.g., the corresponding pre-selection filter). In these embodiments, the tunable reference filters have been illustrated as either separate components in the radio receiver, or as a portion of some other component in the receiver, such as the receiver's local oscillator circuitry.

The need for tunable reference filters in the radio receiver front-end may be eliminated through the use of calibration arrangements that may be used to "pre-tune" the front-end pre-selection filters of the receiver to a desired center frequency. Eliminating the tunable reference filters reduces the component count in the receiver front-end, and increases the overall level of integration in the radio receiver.

Figure 13:
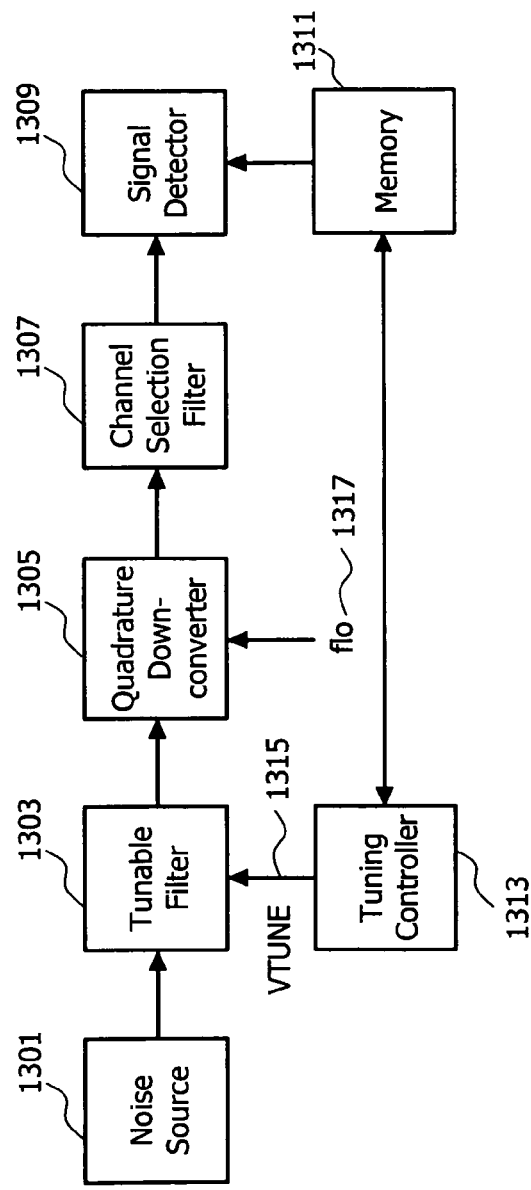
FIG. 13 is a block diagram of an exemplary tuning arrangement in a homodyne radio receiver.

Various exemplary arrangements for tuning radio receivers without using tunable reference filters will now be presented. Referring first to FIG. 13, this figure depicts an exemplary arrangement for tuning a homodyne radio receiver. Recall that the term "homodyne" as used throughout the specification refers to a zero-IF receiver, or a low-IF receiver (i.e., a receiver whose IF is in the same range as the channel spacing).

In the exemplary arrangement, blocks 1303, 1305, and 1307 represent the core front-end receiver functions of the radio receiver. During normal receiver operation, an RF signal is received by an antenna (not shown) and supplied to a tunable band-pass filter, herein referred to as a tunable pre-selection filter 1303. The tunable pre-selection filter 1303 is capable of tunably selecting channels within the desired frequency band. The filter response of the tunable pre-selection filter 1303 may be tuned by adjusting the value of a filter bias signal VTUNE 1315.

From the output of the tunable pre-selection filter 1303, the received signal is down-converted to respective in-phase (I) and quadrature (Q) baseband signals (not shown) by a quadrature down-converter 1305. This is accomplished by mixing the received signal with locally-generated signals 1317 that oscillate at (or near) the desired RF frequency $f_{lo}$, but which are 90 degrees out of phase with respect to one another. The quadrature down-converter 1305 operates in the same manner as described in conjunction with first and second mixers 307, 309 shown in FIG. 3. As indicated earlier, the purpose of separating the received signal into the I and Q baseband signals is to facilitate the demodulation of the signal (i.e., the extraction of the underlying information carried by the received signal). This aspect of the receiver operation is well-known, and need not be discussed here in further detail.

After down-conversion, the received signal comprising the I and Q baseband components (not shown) is supplied to a channel selection filter 1307. In the case of a homodyne receiver, the channel selection filter may be a low-pass filter. The channel selection filter may be analog, digital or some combination of analog and digital. The purpose of the channel selection filter 1307 is to further separate the received signal from the in-band interferers. In addition, the channel selection filter 1307 may condition the received signal for the purpose of avoiding aliasing that can result from sampling performed by downstream analog-to-digital converters. A third possible use of the channel selection filter 1307 is for channel filtering, although this function could alternatively be performed digitally by other downstream receiver components.

For good performance, it is necessary to accurately tune the tunable pre-selection filter 1303 so that the desired channel will be selected. To accomplish this task, tuning circuitry may be coupled to the radio receiver for use during a receiver tuning phase. During the tuning phase, appropriate values for the filter bias signal VTUNE 1315 are determined by the tuning circuitry in order to achieve the desired filter response from the tunable pre-selection filter 1303.

In the exemplary tuning arrangement of FIG. 13, the tuning circuitry includes a noise source (or generator) 1301 that is coupled to the input of the tunable pre-selection filter 1303. The noise source 1301 may be used to generate a wide-band noise signal at the input of the tunable pre-selection filter 1303. The noise band of the source 1301 should cover at least the tuning range of the pre-selection filter 1303. When fed to the pre-selection filter 1303, the wide-band noise signal is first filtered, and then is passed to the quadrature down-converter 1305 and channel selection filter 1307, which together perform the task of channel selection.

Also included in the tuning circuitry is a signal detector 1309 that may be coupled to the output of the channel selection filter 1307. The signal detector 1309 may be used to detect a signal power of signals present at the output of the channel selection filter 1307. The signal detector 1309 may be further coupled to a memory 1311 that is used to store signal power values measured by the signal detector 1309.

Managing the entire filter tuning process during the tuning phase is a tuning controller 1313. The tuning controller 1313 is coupled to the memory 1311, and to the tunable pre-selection filter 1303 through the filter bias signal VTUNE 1315. The tuning controller 1313 may be implemented as a separate micro-controller, as a portion of existing processor hardware within the radio receiver, or as software executing on the radio receiver processor. The tuning controller 1313 is capable of interpreting the signal power information stored in the memory 1311, and then adjusting the value of the filter bias signal VTUNE 1315 accordingly. The value of the filter bias signal VTUNE 1315 may be adjusted repeatedly by the tuning controller 1313 until a desired frequency response is achieved in the tunable pre-selection filter 1303.

When the pre-selection filter 1303 is properly tuned to the desired center frequency, the wide-band noise signal presented at the input of the receiver will produce a corresponding maximum output noise signal (in terms of the signal power) at the output of the channel selection filter 1307. This situation is depicted in the signal flow diagram of FIG. 14.

Figure 14:
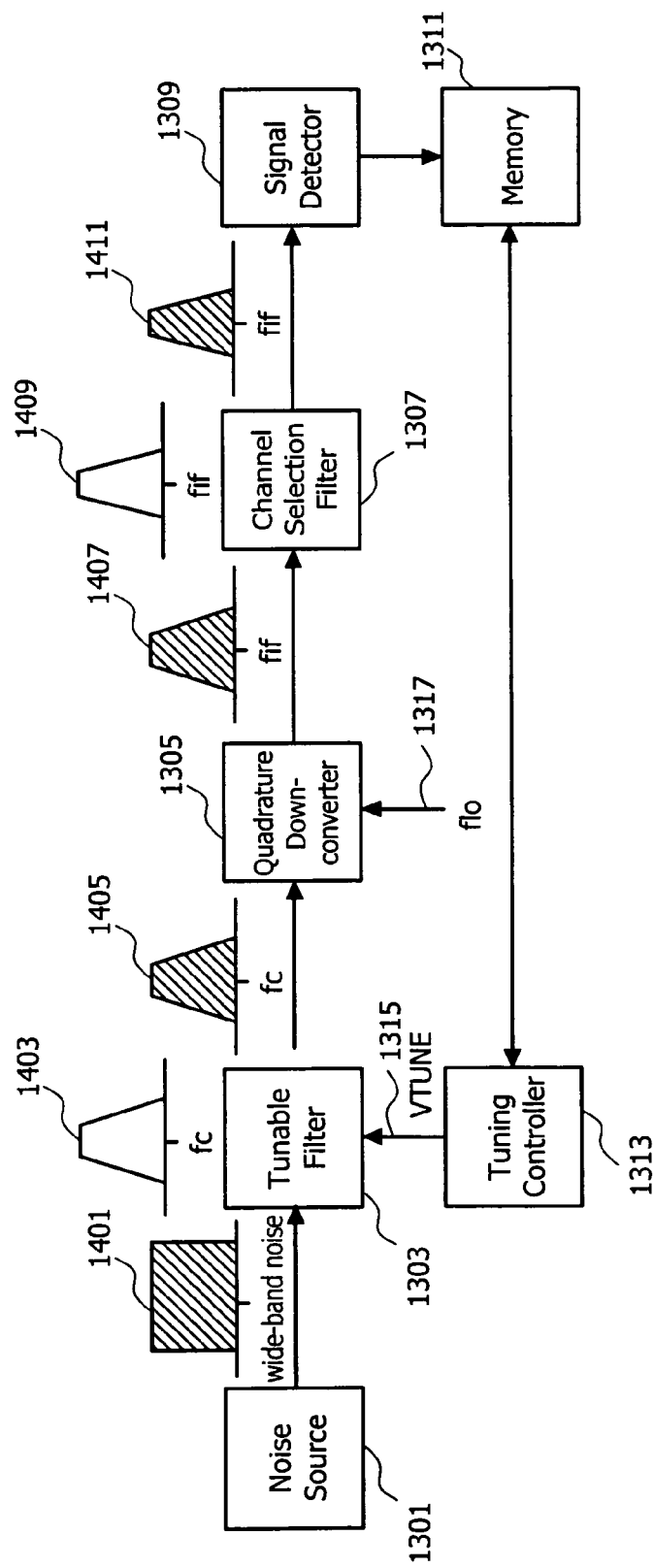
FIG. 14 is a signal flow diagram depicting signal conversion and filtering in a homodyne receiver with a properly tuned pre-selection filter.

In the signal flow diagram of FIG. 14, the noise source 1301 produces a wide-band noise signal 1401. The noise signal 1401 is filtered by tunable pre-selection filter 1303. The pre-selection filter 1303 will achieve a given filter response 1403 for each value of the filter bias signal VTUNE 1315 that is within the tuning range of the pre-selection filter 1303. The center frequency of the filter response 1403 is denoted as $f_c$. The value of the filter bias signal VTUNE 1315 is set by the tuning controller 1313 based upon information stored in the memory 1311 and the previous value of the filter bias signal VTUNE 1315.

After filtering by the tunable pre-selection filter 1303, the filtered noise signal 1405 is fed to the quadrature down-converter 1305. The quadrature down-converter 1305 mixes the filtered noise signal 1405 with locally-generated signals 1317 that oscillate at a frequency $f_{lo}$ that is at (or near) the desired RF frequency, but which are 90 degrees out of phase with respect to one another. The down-converter 1305 produces I and Q baseband signals (not shown) from the filtered noise signal 1405 that are represented by the baseband (near-baseband in the case of low-IF receivers) noise spectrum 1407. The baseband noise spectrum 1407 has a corresponding center frequency $f_{if}$ equal to $(f_c - f_{lo})$. It will be understood that in the case of a direct conversion (or zero-IF) receiver, $f_c$ will equal $f_{lo}$, and $f_{if}$ will be equal to zero, whereas in the case of a low-IF receiver, $f_c$ will be slightly offset from the local oscillator frequency $f_{lo}$. This offset can be tolerated in the receiver if the bandwidth of the pre-selection filter 1303 is sufficiently wide.

After down-conversion, the baseband noise spectrum 1407 is passed to the channel selection filter 1307. The channel selection filter 1307 achieves a corresponding channel selection filter response 1409. The channel selection filter response 1409 has a center frequency equal to $f_{if}$, the same center frequency as the baseband noise spectrum 1407, but has a bandwidth that is preferably less than the tunable pre-selection filter 1303 and the down-converter 1305. Preferably, the bandwidth of the channel selection filter 1307 is also less than the separation between channels in the received signal.

When the center frequency of the tunable pre-selection filter 1303 is properly tuned such that $f_c$ equals ($f_{if}+f_{lo}$), the channel selection filter 1307 will produce a filtered baseband noise spectrum 1411 having a center frequency equal to $f_{if}$ and a bandwidth equal to that of the channel selection filter 1307. Under these bias conditions, the channel selection filter 1307 will produce a filtered baseband noise spectrum 1411 having a maximum signal power. The maximum signal power can be measured by the signal detector 1309, and results of the measurement stored in the memory 1311. The tuning controller 1313 may also record in the memory the value of the filter bias signal VTUNE 1315 that produces the maximum signal power. This optimal value of the filter bias signal VTUNE 1315 may then be used to properly tune the tunable pre-selection filter 1303 to the desired frequency under normal operation conditions.

In contrast to the conditions described above, when the tunable pre-selection filter 1303 is not properly tuned to the desired center frequency, the receiver will not produce a corresponding maximum output noise signal (in terms of the signal power) at the output of the channel selection filter 1307. Indeed, no output noise signal may be produced at the output of the channel selection filter 1307 at all. This situation is depicted in the signal flow diagram of FIG. 15.

Figure 15:
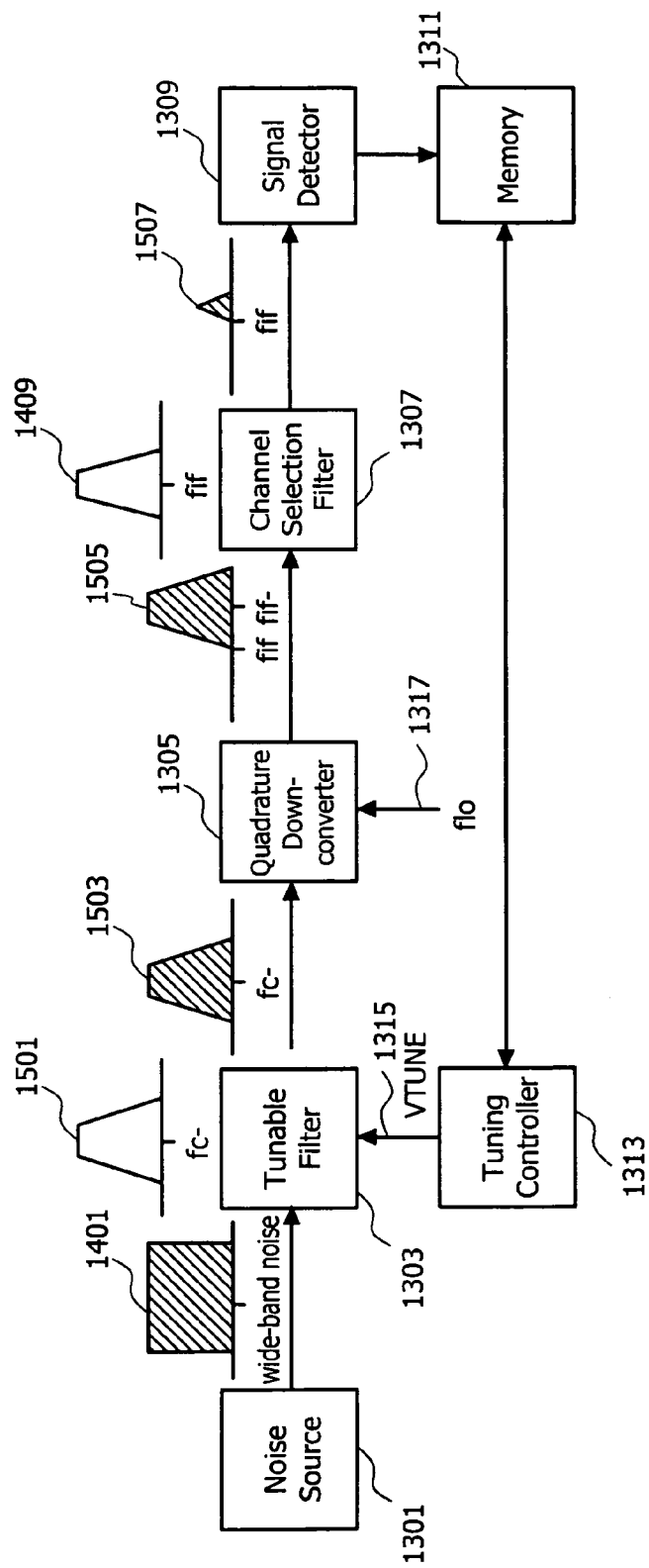
FIG. 15 is a signal flow diagram depicting signal conversion and filtering in a homodyne receiver with an improperly tuned pre-selection filter.

In the signal flow diagram of FIG. 15, the noise source 1301 again produces a wide-band noise signal 1401. The noise signal 1401 is filtered by tunable pre-selection filter 1303. The pre-selection filter 1303 will once again achieve a given filter response 1403 for each value of the filter bias signal VTUNE 1315 that is within the tuning range of the pre-selection filter 1303. The center frequency of the filter response 1501 in FIG. 15 is denoted as $f_{c-}$. The minus sign ("−") indicates that the value of the filter bias signal VTUNE 1315 is such that the center frequency $f_{c-}$ of the tunable pre-selection filter 1303 is below the desired frequency level. Again, the value of the filter bias signal VTUNE 1315 may be set by the tuning controller 1313 based upon information stored in the memory 1311 and the previous value of the filter bias signal VTUNE 1315.

After filtering by the tunable pre-selection filter 1303, the filtered noise signal 1503 is fed to the quadrature down-converter 1305. The quadrature down-converter 1305 again mixes the filtered noise signal 1503 with locally-generated signals 1317 that oscillate at a frequency $f_{lo}$ that is at (or near) the desired RF frequency, but which are 90 degrees out of phase with respect to one another. The down-converter 1305 in turn produces I and Q baseband signals (not shown) from the filtered noise signal 1503 that are represented by the baseband noise spectrum 1505. In contrast to FIG. 14, the baseband noise spectrum 1505 of FIG. 15 has a center frequency $f_{if-}$ that is below the desired baseband frequency of $f_{if}$. This offset occurs because $f_{c-}$ is less than $f_c$ resulting in $f_{if-}$ being equal to ($f_{c-}-f_{lo}$).

After down-conversion, the baseband noise spectrum 1505 is again passed to the channel selection filter 1307 having the desired channel selection filter response 1409. The channel selection filter response 1409 again has a center frequency equal to desired baseband frequency of $f_{if}$. Unlike the situation depicted in FIG. 14, the center frequency $f_{if}$ of the channel selection filter response 1409 is higher than the center frequency $f_{if-}$ of the baseband noise spectrum 1505. Again, the bandwidth of the channel selection filter 1307 is preferably less than the tunable pre-selection filter 1303 and the down-converter 1305.

Improper tuning of the tunable pre-selection filter 1303 causes the center frequency $f_{c-}$ of the baseband noise spectrum 1505 to be offset from the center desired center frequency $f_{if}$ channel selection filter response 1409. Under these bias conditions, the channel selection filter 1307 will produce a distorted filtered baseband noise spectrum 1507. The signal power of the distorted waveform will less than the maximum signal power measured by the signal detector 1309 when the tunable pre-selection filter 1303 is optimally tuned. Indeed, it will understood that no signal power would be measured by the signal detector 1309 if the bandwidths of the baseband noise spectrum 1505 and the channel selection filter response 1409 were to be non-overlapping.

Again, the results of any measurements made by the signal detector 1309 may be stored in the memory 1311. The tuning controller 1313 may use this information to adjust the value of the filter bias signal VTUNE 1315 to produce a more desirable filter response.

Figure 16:
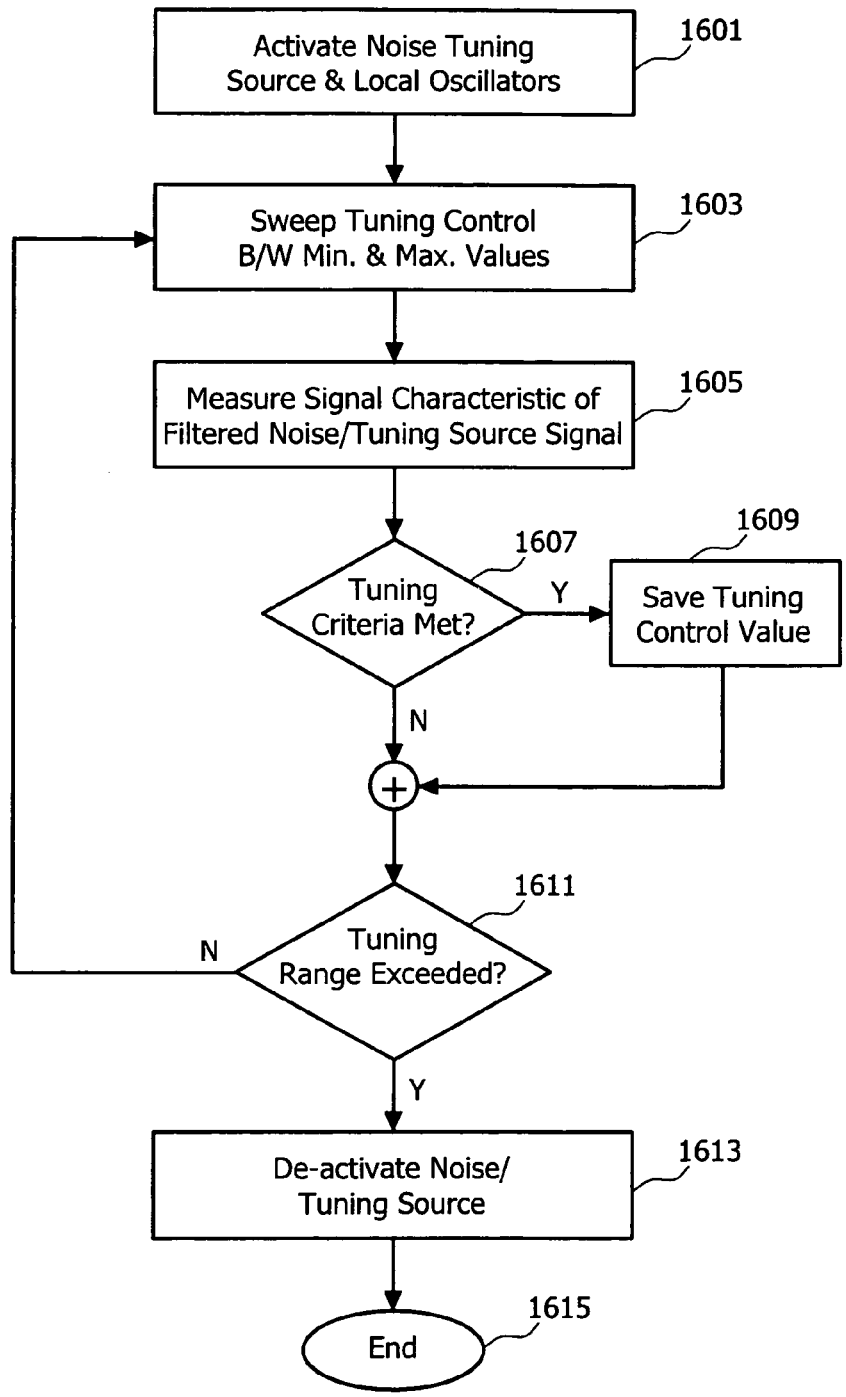
FIG. 16 is a flow diagram showing the steps in an exemplary method for tuning a radio receiver.

FIG. 16 shows an exemplary method for tuning the front-end pre-selection filter(s) of a radio receiver during a dedicated tuning phase. The method begins at step 1601 with the activation of the noise source 1301 and the local oscillator signals $f_{lo}$ 1317. Both the frequency of the noise source 1301 and the local oscillator signals $f_{lo}$ 1307 are set to the appropriate value(s) for recovering the desired radio signal.

After activating the noise source 1301 and the local oscillator signals $f_{lo}$ 1307, the filter bias signal VTUNE 1315 may be swept by the tuning controlling 1313 in step 1603. The filter bias signal VTUNE 1315 signal may be swept between two predetermined values (e.g., a minimum and a maximum bias value) within the tunable range of the pre-selection filter 1303. Next, in step 1605, the signal power of the filtered baseband noise signal (e.g., 1411,1507) at the output of the channel selection filter 1307 may be measured (e.g, by the signal detector 1309).

If it is determined, at step 1607, that the measured signal power of the filtered baseband noise signal (e.g., 1411,1507) is a maximum signal power, the filter bias VTUNE 1315 that produces the maximum signal power for the corresponding noise source and local oscillator input frequencies is saved for future use at step 1609 (e.g. in the memory 1311). Depending on the bandwidth of the tunable pre-selection filter 1303, a so-called "sliding average" could be used over the swept tuning range of the in order to determine the maximum signal power level. Such a method would compensate for any possible ripple in the measured waveform.

The process of adjusting the tuning bias and measuring the signal power is repeated until the maximum (or minimum) tuning bias is exceeded at step 1611. When the tuning range is exceeded, the noise source 1301 is turned off at step 1613, and the tuning phase of operation ends at step 1615. Then, whenever the receiver receives a signal on a given channel, the tuning controller 1313 can access the memory 1311 and determine the value of the filter bias signal VTUNE 1315 that should be used to properly tune the receiver front-end.

The above method may be implemented as part of a "one-time" factory training procedure that is performed during production of the radio receiver. This training procedure may be used in order to determine appropriate preset values for the filter bias signal 1315. It will be understood that implementing such a "one-time" process would require that the filter response remain stable over both time and temperature changes.

Alternatively, the receiver front-end may be tuned each time the radio receiver is switched on, or whenever the receiver receives network updates. Moreover, a tuning phase may be entered by the receiver just prior to receiving a timeslot, during which time the receiver front-end circuitry will be active. Also, the radio transmitter power amplifier (PA) may be used as a noise source to train the receiver front-end, as the PA will be active during timeslot transmission. A preferred embodiment would employ a combination of first "factory training" the radio receiver, and then performing periodic tuning adjustments whenever the radio transmitter is active.

Figure 17:
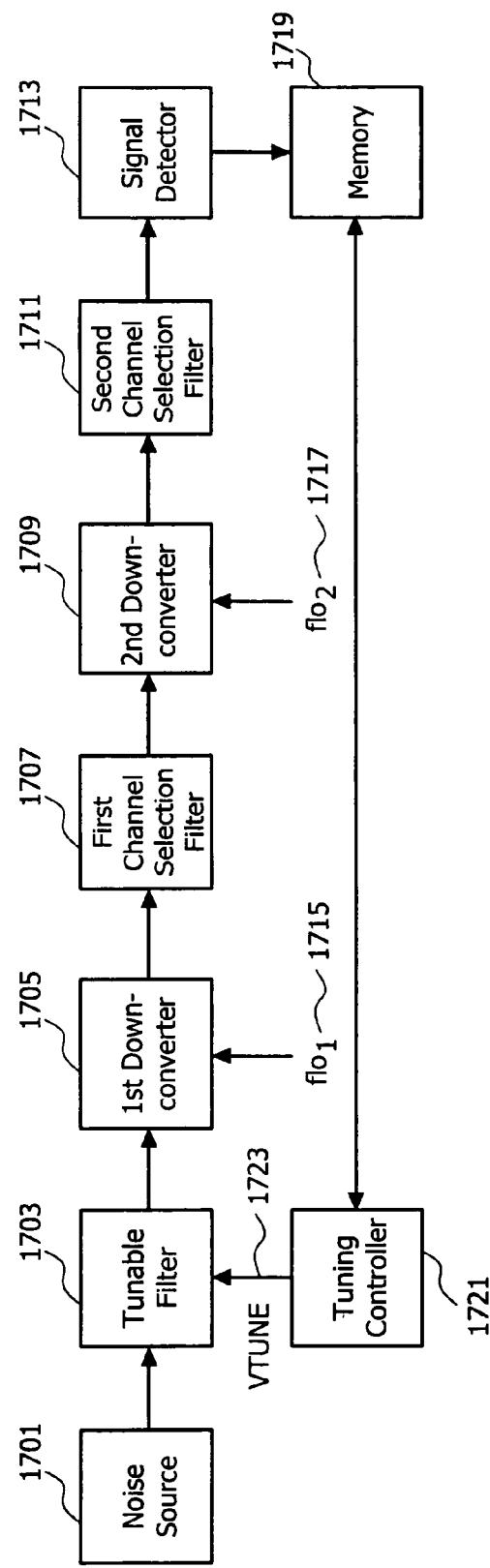
FIG. 17 is a block diagram of an exemplary tuning arrangement in a heterodyne radio receiver.

The described tuning apparatus and methods could be equally applied to heterodyne radio receivers. FIG. 17 depicts a heterodyne radio receiver in which blocks 1703, 1705, 1707, 1709, and 1711 represent the core front-end receiver functions of the heterodyne radio receiver. During normal receiver operation, an RF signal is received by an antenna (not shown) and supplied to a tunable band-pass filter, herein referred to as a tunable pre-selection filter 1703. The tunable pre-selection filter 1703 is capable of tunably selecting channels within the desired frequency band. The filter response of the tunable pre-selection filter 1703 may be tuned by adjusting the value of a filter bias signal VTUNE 1715.

From the output of the tunable pre-selection filter 1703, the filtered receive signal is down-converted to a first IF signal by a first down-converter 1705. This is accomplished by mixing the filtered receive signal with a first locally-generated signal 1715 that oscillates at a frequency $f_{lo1}$ that differs from the carrier frequency of the RF signal by a known amount. The frequency of the first IF signal is related to the difference between the RF frequency and the frequency $f_{lo1}$ of the first local oscillator signals 1715.

After the first down-conversion, the first IF signal is supplied to a first channel selection filter 1707. Unlike the preferred low-pass channel selection filter 1307 shown in the homodyne receiver of FIG. 13, the first channel selection filter 1707 is preferably an analog band-pass filter. In addition to or instead of channel selection, the filter 1707 may be used to remove noise from the down-converted first IF signal, or to block other undesired signals present in the signal path.

From the output of the first channel selection filter 1707, the filtered IF signal is down-converted a second time to respective I and Q baseband signals (not shown) by a second down-converter 1709. This is accomplished by mixing the filtered IF signal with locally-generated signals 1717 that oscillate at a frequency $f_{lo2}$ that is at (or near) the IF frequency, but which are 90 degrees out of phase with respect to one another. The second down-converter 1709 operates in the same manner as described in conjunction with first and second mixers 307, 309 shown in FIG. 3. As indicated earlier, the purpose of separating the received signal into the I and Q baseband signals is to facilitate the demodulation of the signal (i.e., the extraction of the underlying information carried by the received signal). This aspect of the receiver operation is well-known, and need not be discussed here in further detail.

Following the second down-conversion, the received signal comprising its I and Q baseband components (not shown) is supplied to a second channel selection filter 1711. As in the case of the homodyne receiver shown in FIG. 13, the second channel selection filter 1711 may be a low-pass filter. Again, the second channel selection filter 1711 may be analog, digital or some combination of analog and digital.

The purpose of both the first and second channel selection filters 1707, 1711 is to further separate the received signal from the in-band interferers. In addition, the channel selection filters 1707, 1711 may condition the received signal for the purpose of avoiding aliasing that can result from sampling performed by downstream analog-to-digital converters. A third possible use of the channel selection filters 1707,1711 is for channel filtering, although this function could alternatively be performed digitally by other downstream receiver components.

For good performance, it is again necessary to accurately tune the response of the tunable pre-selection filter 1703 so that the desired channel will be selected. To accomplish this task, tuning circuitry similar to that used in the arrangement of FIG. 13 may be coupled to the radio receiver for use during the receiver tuning phase. During the tuning phase, appropriate values for the filter bias signal VTUNE 1723 are determined by the tuning circuitry in order to achieve the desired filter response from the tunable pre-selection filter 1703.

In the exemplary tuning arrangement of FIG. 17, the tuning circuitry includes a noise source (or generator) 1701 that is coupled to the input of the tunable pre-selection filter 1703. The noise source 1701 may be used to generate a wide-band noise signal at the input of the tunable pre-selection filter 1703. Again, the noise band of the source 1701 should cover at least the tuning range of the pre-selection filter 1703. When fed to the pre-selection filter 1703, the wide-band noise signal is first filtered, and then is passed to the first and second down-converters 1705, 1709 and the first and second channel selection filters 1707,1711, which together perform the task of channel selection.

Also included in the tuning circuitry is a signal detector 1713 that may be coupled to the output of the second channel selection filter 1711. The signal detector 1713 may be used to detect a signal power of signals present at the output of the channel selection filter 1711. The signal detector 1713 may be further coupled to a memory 1719 that is used to store signal power values measured by the signal detector 1719.

Again managing the entire filter tuning process during the tuning phase is a tuning controller 1721. The tuning controller 1721 is coupled to the memory 1719, and to the tunable pre-selection filter 1703 through the filter bias signal VTUNE 1723. The tuning controller 1721 may be implemented as a separate micro-controller, as a portion of existing processor hardware within the radio receiver, or as software executing on the radio receiver processor. The tuning controller 1721 is capable of interpreting the signal power information stored in the memory 1719, and then adjusting the value of the filter bias signal VTUNE 1723 accordingly. The value of the filter bias signal VTUNE 1723 may be adjusted repeatedly by the tuning controller 1721 until a desired frequency response is achieved in the tunable pre-selection filter 1703. Such a process for adjusting the filter bias signal VTUNE 1723 is shown in FIG. 16

The wide-band noise source (or generator) needed at the input of the tunable pre-selection filters 1303,1703 may be implemented in variety of ways. For example, the noise source may be a stand-alone noise generator used, perhaps, in a factory training procedure. Alternatively, the radio transmitter PA may be used to generate the wide-band signal. Likewise, a separate power amplifier may be added in the signal path before the tunable pre-selection filters. Also, the tunable pre-selection filters may be arranged in the signal path after the existing LNA in the receiver front-end. Finally, the local oscillator signal may be used tune the receiver front-end of a homodyne radio receiver.

Figure 18:
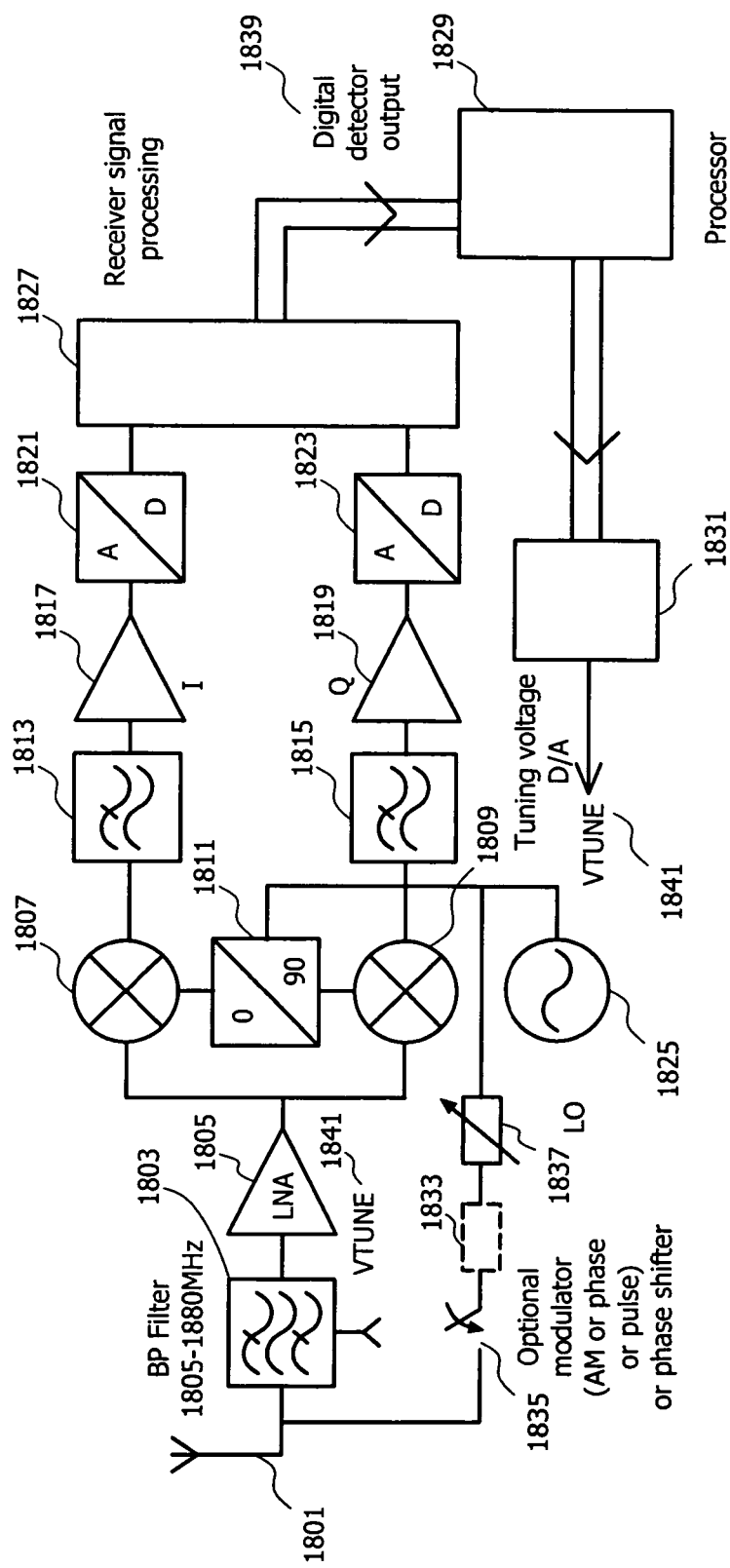
FIG. 18 is a block diagram of an exemplary tuning arrangement in a homodyne radio receiver using a locally generated tuning signal.

An exemplary arrangement showing the use of the local oscillator signal to tune the radio receiver front-end is provided in FIG. 18. Referring to the arrangement of FIG.

18, this is a block diagram of a homodyne radio receiver with built-in tuning circuitry. Again, the term "homodyne" refers to a zero-IF receiver, or a low-IF receiver (i.e., a receiver whose IF is in the same range as the channel spacing). Under normal operating conditions In the exemplary receiver, I and Q digital signals are generated from a received RF signal.

To accomplish this function, the RF signal is received by an antenna 1801 and supplied to a tunable band-pass filter, herein referred to as a tunable pre-selection filter 1803. The tunable pre-selection filter 1803 is capable of tunably selecting channels within the desired frequency band. In the exemplary embodiment, the desired frequency band is the range from 1805 to 1880 MHZ.

From the output of the tunable pre-selection filter 1803, the received signal is supplied to a low noise amplifier 1805. After amplification, the signal is down-converted to respective I and Q baseband signals by first and second mixers 1807, 1809. This is accomplished by mixing the amplified received signal with respective locally-generated signals that each oscillate at (or near) the desired RF frequency, but which are 90 degrees out of phase with respect to one another. As indicated earlier, the purpose of separating the received signal into the I and Q baseband signals is to facilitate the demodulation of the signal (i.e., the extraction of the underlying information carried by the received signal). This aspect of the receiver operation is well-known, and need not be discussed here in further detail.

The respective locally-generated signals for use by the first and second mixers 1807, 1809 are created by first using a local oscillator circuit 1825 to generate a signal of the desired frequency. The local oscillator circuit 1825 is preferably implemented as a phase-locked loop (PLL). The signal from the local oscillator circuit 1825 is then supplied to a phase-shifting circuit 1811 that shifts the phase of the locally-generated signal by 90 degrees. The original (non-shifted) signal may then be supplied to the first mixer 1807, while the phase-shifted signal may be supplied to the second mixer 1809.

After down-conversion, the I and Q baseband signals are supplied to respective first and second channel selection filters 1813, 1815. The purpose of the first and second channel selection filters 1813, 1815 is to further separate the received signal from the in-band interferers. In addition, the first and second channel selection filters 1813, 1815 may condition their respective input signals for the purpose of avoiding aliasing that can result from sampling that is performed by downstream analog-to-digital converters. A third possible use of the first and second channel selection filters 1813, 1815 is for channel filtering, although this could alternatively be performed digitally by downstream receiver components.

After channel selection, the resultant I and Q baseband signals may be subjected to further filtering and amplification, e.g., by respective first and second amplifiers 1817, 1819. Because this exemplary embodiment depicts a digital environment, the resultant analog signals are converted into digital form by respective first and second analog-to-digital (A/D) converters 1821, 1823.

In a homodyne receiver such as the one depicted in FIG. 18, the frequency of the signal produced by the local oscillator 1825 is roughly the same as the carrier frequency of the desired radio signal. Since these two frequencies are similar, the local oscillator 1825 may be used as a tuning signal to internally tune the receiver front-end.

During an automated tuning procedure, the signal produced by the local oscillator 1825 may be further coupled to the input of the tunable pre-selection filter 1803 by way of a tuning mode switch 1835. The signal produced by the local oscillator 1825 is preferably modulated (e.g., using amplitude, phase, or pulse modulation) by a modulator 1833 to aid in the detection of the tuning signal using the same local oscillator. The signal from the local oscillator 1825 may be attenuated by a variable attenuator 1837 to produce the desired tuning signal.

As is the case during normal receiver operation, digitized signals from the A/D convertors 1821, 1823 are fed to a receiver signal processing unit 1827 during the automated tuning procedure. In a homodyne receiver, both the amplitude and the phase of a modulated noise signal can be measured by the receiver signal processing unit 1827. Accordingly, both the amplitude and phase of the tuning signal may be measured using the typical receiver detection circuitry included within the receiver signal processing unit 1827.

Measured samples of the amplitude and/or the phase of the noise signal are supplied as digital detector output 1839 to a general processing unit 1829. This processing unit may be may be implemented as a separate micro-controller, as a portion of existing processor hardware within the radio receiver, or as software executing on the radio receiver processor. The general processing unit 1829 is capable of interpreting the digital detector output 1839 received from the receiver signal processing unit 1827, and then adjusting the value of the filter bias signal VTUNE 1841 accordingly.

The tunable pre-selection filter 1803 may be either analog, digital, or some combination of analog or digital. In the case of having an analog pre-selection filter, the general processing unit 1829 may be further coupled to a tuning voltage D/A convertor 1831 to produce the desired analog filter bias signal. With a digital pre-selection filter, the general processing unit 1829 may be directly used to adjust the filter bias. The value of the filter bias signal VTUNE 1841 may be adjusted repeatedly by the general processing unit 1829 until a desired frequency response is achieved in the tunable pre-selection filter 1803.

The tuning process described in conjunction with FIG. 16 may also be used to adjust the filter bias signal VTUNE 1841 when using a modulated local oscillator signal as the tuning signal. For example, at step 1605, rather than measuring the signal power at the receiver output, as described earlier, the receiver signal processing unit 1827 may measure the amplitude and/or phase of the measured samples. Then, at step 1607, rather than determining whether the output power is maximal, the general processing unit 1829 may determine whether there exists a correspondence between the amplitude and/or phase of the measured samples and the amplitude and/or phase of the tuning signal. If a such a correspondence exists, the filter bias signal VTUNE 1841 that produces the correspondence is saved at step 1609 and the process continues as described above.

Alternatively, the signal produced by the local oscillator circuit 1825 may remain unmodulated, and still be used as a tuning signal for tuning the pre-selection filter 1803. The method illustrated in FIG. 16 may also be used for tuning the pre-selection filter 1803 using an unmodulated local oscillator signal as the tuning signal. According to a first exemplary tuning method, a DC offset in both the I and Q signals (denoted $I_{DC}$ and $Q_{DC}$ respectively) may first be measured prior to activating the tuning source at step 1601. These measured values represent an inherent DC offset that exists in the receiver front-end circuitry. The filter bias signal VTUNE 1841 may be set to any value while the inherent DC offset in the front-end circuitry is being measured. The process of determining an optimal filter bias signal VTUNE 1841 then continues according to FIG. 16 as previously described.

When using an unmodulated local oscillator signal as the tuning signal, the signal power at the output of the front-end circuit may be measured at step 1605 according to following process. First, a DC signal value in both the I and Q signals (denoted as $I_{MEAS}$ and $Q_{MEAS}$ respectively) is measured with the unmodulated local oscillator signal being used as the tuning signal input to the pre-selection filter 1803. Then, the signal power of the output signal may be calculated for each respective value of the filter bias signal VTUNE 1841 according to the following equation:

$$(I_{MEAS-IDC})^2 + (Q_{MEAS-QDC})^2 \qquad (1)$$

The value of the filter bias signal VTUNE 1841 that produces the maximum signal power according to equation (1) is saved at step 1609 for later use during normal receiver operation.

According to a related second exemplary tuning method, the amplitude of the output signal rather than the signal power may be measured at step 1605 according to the following equation:

$$\text{MAX}(|I_{MEAS-IDC}|, |Q_{MEAS-QDC}|) \qquad (2)$$

Then, the value of the filter bias signal VTUNE 1841 that produces the maximum signal amplitude according to equation (2) at step 1607 is saved at step 1609 for later use during normal receiver operation.

According to yet a third exemplary tuning method using an unmodulated local oscillator signal as the tuning signal, an optional variable phase shifter 1833' may be inserted in the tuning signal path in place of the modulator 1833. An optimal value for the amount of phase shift produced by the phase shifter 1833' may be determined prior to tuning the pre-selection filter 1803 according to the following process. First, the filter bias signal VTUNE 1841 is set to some predetermined value, preferable a value in the center of the tuning range of the filter. Then, the local oscillator signal is fed to the phase shifter 1833', and the amount of phase shift is varied until a maximum amplitude is measured in one of either the I and the Q signals.

Using the amount of phase shift determined above, an optimal filter bias signal VTUNE 1841 for tuning the pre-selection filter 1803 may be determined according to the process of FIG. 16. Instead of measuring the signal power, however, the amplitude of either the I or the Q signal (whichever was used to calculate the optimal amount of phase shift above) is measured at step 1605. Then, the value of the filter bias signal VTUNE 1841 that produces the maximum amplitude in the I or the Q signal at step 1607 is saved at step 1609 for later use during normal receiver operation.

Each of above-described methods of tuning the pre-selection filter 1803 using an unmodulated local oscillator signal require that certain measurements be made prior to determining an optimal value for the filter bias signal VTUNE 1841. It is preferable that the filter bias signal VTUNE 1841 be set to the center of the tuning range of the filter when making these measurements. It will be understood that the sensitivity of the front-end circuitry should be sufficient such that these measurements can be made irrespective of the value of the filter bias signal VTUNE 1841. Should this not be the case, the attenuation of the variable attenuator 1837 may be suitably adjusted so as to boost the amplitude of the local oscillator signal, in order that the required measurements can be made.

The tuning arrangement shown in FIG. 18 has certain advantages over the tuning arrangements previously described. For example, in the arrangement of FIG. 18, a tuning of the pre-selection filter 1803 may be performed under internal processor control (i.e., within the radio itself) at any convenient time during either production or during normal use of the receiver. As a result, additional factory tuning procedures need not be used, saving both production time and production costs. In addition, the need for an external noise source is eliminated. Finally, the component count in the receiver is minimized, as the tuning arrangement uses only the existing receiver detection and control circuitry in conjunction with novel tuning software that can be executing on the existing radio processor.

It will be understood that more than one tuning voltage may be determined using any of the arrangements described in FIGS. 13–18 if either more than one filter requires tuning, or if a single filter is to be tuned for multiple frequency bands. Moreover, any of the arrangements described above provide the receiver with an ability to withstand strong in-band interferers by narrowing the bandwidth of the front-end receive filter(s). Narrowing the bandwidth of a front-end receive filter improves in-band blocking, inter-modulation suppression, and AM-suppression in the receive path. This, in turn, may lead to lower linearity requirements being placed on the front-end receive circuitry, thereby improving the over noise and power consumption performance in the radio receiver.

It should be emphasized that the terms "comprises" and "comprising", when used in this specification as well as the claims, are taken to specify the presence of stated features, steps or components; but the use of these terms does not preclude the presence or addition of one or more other features, steps, components or groups thereof.

The invention has been described with reference to particular embodiments. However, it will be readily apparent to those skilled in the art that it is possible to embody the invention in specific forms other than those of the preferred embodiment described above. This may be done without departing from the spirit of the invention.

Thus, the exemplary embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A tuning arrangement in a radio receiver comprising:
   a front-end circuit including a tunable band-pass filter for receiving an RF signal from a connection to an antenna and filtering said received RF signal to tunably select channels within at least one frequency band of said RF signal;
   a noise source coupled to an input of the tunable band-pass filter for introducing a wide-band noise signal into the front-end circuit;
   a signal detector coupled to an output of the front-end circuit for measuring at least one signal power associated with a filtered noise signal derived from the wide-band noise signal; and
   a tuning controller coupled to the tunable band-pass filter by a tuning control signal;

wherein the tuning controller adjusts the tuning control signal in response to the at least one measured signal power for tuning the tunable band-pass filter to a desired filter response.

2. The arrangement of claim 1, further comprising: a memory coupled to the signal detector and to the tuning controller for storing the at least one measured signal power for use by the tuning controller in adjusting the tuning control signal.

3. The arrangement of claim 1, wherein the tuning controller adjusts the tuning control signal in a manner such that the tuning control signal will cause the signal power associated with the filtered noise signal to achieve a maximum value.

4. The arrangement of claim 1, further comprising: a down-converter having an input coupled to an output of the tunable band-pass filter, the down-converter for generating a baseband signal by mixing the filtered noise signal with a local oscillator signal.

5. The arrangement of claim 4, further comprising: a channel selection filter having an input coupled to an output of the down-converter and having an output that corresponds to the output of the front-end circuit.

6. The arrangement of claim 5, wherein the channel selection filter is a low-pass filter.

7. The arrangement of claim 5, wherein the down-converter and channel selection filter together achieve a composite filter response having a center frequency that is approximately equal to a difference between a center frequency of the desired response of the tunable band-pass filter and the frequency of the local oscillator signal.

8. The arrangement of claim 1, wherein the tunable band-pass filter is tunable within a range spanning one predefined radio frequency band.

9. The arrangement of claim 1, wherein the tunable band-pass filter is tunable within a range spanning at least two predefined radio frequency bands.

10. The arrangement of claim 1, further comprising:
a first down-converter coupled to an output of the tunable band-pass filter for generating an intermediate frequency (IF) signal by mixing the filtered noise signal with a first local oscillator signal.

11. The arrangement of claim 10, further comprising:
a first channel selection filter having an input coupled to an output of the first down-converter.

12. The arrangement of claim 11, further comprising:
a second down-converter having an input coupled to an output of the first channel selection filter for generating a baseband signal by mixing the IF signal with a second local oscillator signal.

13. The arrangement of claim 12, further comprising:
a second channel selection filter having an input coupled to an output of the second down-converter and having an output that corresponds to the output of the front-end circuit.

14. The arrangement of claim 13, wherein the first channel selection filter is a band-pass filter and the second channel selection filter is a low-pass filter.

15. The arrangement of claim 13, wherein the first and second down-converters and the first and second channel selection filters together achieve a composite filter response having a center frequency that is approximately equal to a center frequency of the desired response of the tunable band-pass filter minus the frequencies of the first and second local oscillator signals.

16. The arrangement of claim 1, wherein the noise source is at least one of:
a stand-alone noise generator separate from the radio receiver;
a radio transmitter power amplifier operatively coupled to the radio receiver;
a dedicated noise power amplifier integrated into the radio receiver and used only during a radio tuning phase; and
a low noise amplifier for amplifying the RF signal during normal radio operation and configured for generating the wide-band noise signal during the radio tuning phase.

17. The arrangement of claim 1, wherein the tuning controller is at least one of:
a stand-alone processor separate from the radio receiver;
a dedicated microprocessor integrated into the radio receiver and used only during a radio tuning phase;
a receiver signal processor for processing the RF signal during normal radio operation and configured for adjusting the tuning control signal during the radio tuning phase; and
a software program executing on the receiver signal processor during the radio tuning phase.

18. The arrangement of claim 1, wherein the wide-band noise signal has a bandwidth that is at least equal to a tuning range of the tunable band-pass filter.

19. A tuning arrangement in a radio receiver, comprising:
a front-end circuit including a tunable band-pass filter for receiving an RF signal from a connection to an antenna and filtering said received RF signal to tunably selecting channels within at least one frequency band of said RF signal;
a local oscillator circuit for generating a local oscillator signal;
a switch for supplying a tuning signal derived from the local oscillator signal to an input of the tunable band-pass filter during a radio tuning phase, wherein said tuning signal is filtered by said tunable band-pass filter during said tuning phase; and
a signal processor for processing the RF signal during normal radio operation and for generating a control signal based on at least one signal characteristic of a filtered tuning signal derived from the tuning signal during the radio tuning phase;
wherein the control signal is supplied to the tunable band-pass filter for tuning the filter to a desired filter response.

20. The arrangement of claim 19, wherein the at least one signal characteristic includes an amplitude and a phase of the filtered tuning signal.

21. The arrangement of claim 20, wherein the signal processor adjusts the control signal in a manner such that there exists a correspondence between the at least one signal characteristic of the filtered tuning signal and a comparable at least one signal characteristic of the tuning signal.

22. The arrangement of claim 19, further comprising:
a modulator coupled between the switch and the local oscillator circuit for modulating the tuning signal during the tuning phase.

23. The arrangement of claim 22, wherein the tuning signal is modulated by one of amplitude, phase, and pulse modulation.

24. The arrangement of claim 19, further comprising:
an attenuator coupled between the switch and the local oscillator circuit for attenuating the tuning signal during the tuning phase.

25. The arrangement of claim 19, further comprising a phase shifter for shifting the phase of the tuning signal.

26. The arrangement of claim 19, further comprising:
a digital-to-analog converter coupled between the signal processor and the tunable band-pass filter for converting the control signal into an analog signal.

27. The arrangement of claim 19, further comprising:
at least one mixer for generating a baseband signal by mixing the filtered tuning signal with the local oscillator signal.

28. The arrangement of claim 19, wherein the tunable band-pass filter is tunable within a range spanning one predefined radio frequency band.

29. The arrangement of claim 19, wherein the tunable band-pass filter is tunable within a range spanning at least two predefined radio frequency bands.

30. The arrangement of claim 19, wherein the signal processor includes a software program for controlling the adjustment of the control signal during the radio tuning phase.

31. A method for tuning in a radio receiver, the method comprising the steps of:
generating a tuning signal;
supplying the tuning signal to a tunable band-pass filter included in the radio receiver to generate a filtered tuning signal;
sweeping a control signal of the tunable band-pass filter between a minimum tuning value and a maximum tuning value;
measuring at least one signal characteristic of the filtered tuning signal while sweeping the control signal between the minimum and maximum tuning values;
determining an optimal tuning value based upon the at least one measured signal characteristic;
supplying the optimal tuning value to the control signal of the tunable band-pass filter to tune the filter to a desired filter response; and
filtering RF signals using said tunable band-pass filter.

32. The method of claim 31, wherein the tuning signal is a wide-band noise signal.

33. The method of claim 32, wherein the wide-band noise signal has a bandwidth that is at least equal to a tuning range of the tunable band-pass filter.

34. The method of claim 32, wherein the at least one signal characteristic includes a signal power associated with the filtered tuning signal.

35. The method of claim 34, wherein supplying the optimal tuning value to the control signal of the tunable band-pass filter results in the signal power associated with the filtered tuning signal achieving a maximum value.

36. The method of claim 35, wherein the maximum value of the signal power associated with the filtered tuning signal is determined by computing a sliding average of the signal power.

37. The method of claim 31, wherein the tuning signal is derived from a same local oscillator signal used to generate a baseband signal from a received RF signal in the radio receiver during normal radio operation.

38. The method of claim 37, wherein the tuning signal is derived by modulating the local oscillator signal.

39. The method of claim 38, wherein the local oscillator signal is modulated by one of amplitude, phase, and pulse modulation.

40. The method of claim 38, wherein the at least one signal characteristic includes at least one of an amplitude and a phase of the filtered tuning signal.

41. The method of claim 40, wherein supplying the optimal tuning value to the control signal of the tunable band-pass filter results in a correspondence between the at least one of the amplitude and phase of the filtered tuning signal and at least one of an amplitude and a phase of the tuning signal.

42. The method of claim 37, wherein the tuning signal is derived by attenuating the local oscillator signal.

43. The method of claim 37, further comprising the step of:
measuring a DC offset $I_{DC}$ in an in-phase (I) signal derived from the filtered tuning signal, and a DC offset $Q_{DC}$ in a quadrature-phase (Q) signal derived from the filtered tuning signal before supplying the tuning signal to the tunable band-pass filter.

44. The method of claim 43, wherein the at least one signal characteristic includes both a DC signal value $I_{MEAS}$ in an in-phase (I) signal derived from the filtered tuning signal, and a DC signal value $Q_{MEAS}$ in a quadrature-phase (Q) signal derived from the filtered tuning signal.

45. The method of claim 44, further comprising the step of calculating a signal power associated with the filtered tuning signal according to the equation:

$$(I_{MEAS-IDC})^2 + (Q_{MEAS-QDC})^2.$$

46. The method of claim 45, wherein supplying the optimal tuning value to the control signal of the tunable band-pass filter results in the signal power associated with the filtered tuning signal achieving a maximum value.

47. The method of claim 44, further comprising the step of calculating an amplitude associated with the filtered tuning signal according to the equation:

$$\mathrm{MAX}(|I_{MEAS-IDC}|, |Q_{MEAS-QDC}|).$$

48. The method of claim 47, wherein supplying the optimal tuning value to the control signal of the tunable band-pass filter results in the amplitude associated with the filtered tuning signal achieving a maximum value.

49. The method of claim 37, further comprising the step of:
determining an optimal phase shift of the tuning signal before supplying the tuning signal to the tunable band-pass filter by varying the phase of the tuning signal until a maximum amplitude is achieved in one of an in-phase (I) signal derived from the filtered tuning signal and a quadrature-phase (Q) signal derived from the filtered tuning signal;
wherein the optimal phase shift is applied to the tuning signal when measuring the at least one signal characteristic of the filtered tuning signal while sweeping the control signal between the minimum and maximum tuning values.

50. The method of claim 49, wherein the at least one signal characteristic includes an amplitude associated with the one of the I signal and the Q signal used in determining the optimal phase shift of the tuning signal.

51. The method of claim 50, wherein supplying the optimal tuning value to the control signal of the tunable band-pass filter results in the amplitude with the one of the I signal and the Q signal used in determining the optimal phase shift of the tuning signal achieving a maximum value.

52. The method of claim 31, wherein the method is implemented as part of training procedure performed during production of the radio receiver.

53. The method of claim 52, wherein the method is further implemented using a radio transmitter power amplifier operatively coupled to the radio receiver to generate the tuning signal during radio transmission.

54. The method of claim 31, wherein the method is implemented each time the radio receiver is switched on.

55. The method of claim 31, wherein the method is implemented whenever the radio receiver receives network updates.

56. The method of claim 31, wherein the method is implemented prior to receiving a timeslot in the radio receiver.

57. The tuning arrangement of claim 1, wherein said tunable band-pass filter is used to select channels within said at least one frequency band after being tuned by said tuning controller.

58. The tuning arrangement of claim 19, wherein said tunable band-pass filter is used to select channels within said at least one frequency band after being tuned.

59. The method of claim 31, further comprising the step of:

selecting channels using said band-pass filter after said filter has been tuned.

* * * * *

UNITED STATES PATENT AND TRADEMARK OFFICE
CERTIFICATE OF CORRECTION

PATENT NO. : 6,978,125 B2
DATED : December 20, 2005
INVENTOR(S) : Bo Lindell et al.

It is certified that error appears in the above-identified patent and that said Letters Patent is hereby corrected as shown below:

Column 20,
Line 62, after "tune the" insert -- tunable resonator of VCO 1127 is, in accordance with one aspect of the invention, also --.

Column 36,
Line 29, change "$(I_{MEAS-IDC})^2+(Q_{MEAS-QDC})^2$" to -- $(I_{MEAS}-I_{DC})^2+(Q_{MEAS}-Q_{DC})^2$ --.
Line 39, change "$MAX(|I_{MEAS-IDC}|,|Q_{MEAS-QDC}|)$" to -- $MAX(|I_{MEAS}-I_{DC}|, |Q_{MEAS}-Q_{DC}|)$ --.

Signed and Sealed this

Twenty-first Day of February, 2006

JON W. DUDAS
*Director of the United States Patent and Trademark Office*